(12) United States Patent
Yang et al.

(10) Patent No.: US 10,867,906 B2
(45) Date of Patent: Dec. 15, 2020

(54) CONDUCTIVE STRUCTURES IN SEMICONDUCTOR DEVICES

(71) Applicant: Taiwan Semiconductor Manufacturing Co., Ltd., Hsinchu (TW)

(72) Inventors: Tai-I Yang, Hsinchu (TW); Yu-Chieh Liao, Taoyuan (TW); Tien-Lu Lin, Hsinchu (TW); Tien-I Bao, Dayuan Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/006,120

(22) Filed: Jun. 12, 2018

(65) Prior Publication Data
US 2018/0301409 A1   Oct. 18, 2018

Related U.S. Application Data

(62) Division of application No. 14/524,228, filed on Oct. 27, 2014, now Pat. No. 10,002,826.

(51) Int. Cl.
*H01L 23/522* (2006.01)
*H01L 23/485* (2006.01)
(Continued)

(52) U.S. Cl.
CPC .... *H01L 23/5226* (2013.01); *H01L 21/76816* (2013.01); *H01L 21/76831* (2013.01);
(Continued)

(58) Field of Classification Search
CPC ......... H01L 2924/0002; H01L 2924/00; H01L 21/76816; H01L 21/76831;
(Continued)

(56) References Cited

U.S. PATENT DOCUMENTS 6,924,228 B2   8/2005   Kim et al.
7,180,193 B2   2/2007   Liu et al.
(Continued)

FOREIGN PATENT DOCUMENTS

CN   102142405 A   8/2011
JP   2007-53399 A   3/2007
(Continued)

*Primary Examiner* — Duy T Nguyen
(74) *Attorney, Agent, or Firm* — Sterne, Kessler, Goldstein & Fox P.L.L.C.

(57) ABSTRACT

A semiconductor device structure is provided. The semiconductor device structure includes a semiconductor substrate. The semiconductor device structure includes a first dielectric layer over the semiconductor substrate. The semiconductor device structure includes a first conductive line embedded in the first dielectric layer. The semiconductor device structure includes a second dielectric layer over the first dielectric layer and the first conductive line. The semiconductor device structure includes a second conductive line over the second dielectric layer. The second dielectric layer is between the first conductive line and the second conductive line. The semiconductor device structure includes conductive pillars passing through the second dielectric layer to electrically connect the first conductive line to the second conductive line. The conductive pillars are spaced apart from each other.

21 Claims, 31 Drawing Sheets

(51) Int. Cl.
*H01L 29/417* (2006.01)
*H01L 23/532* (2006.01)
*H01L 21/768* (2006.01)
*H01L 29/78* (2006.01)
*H01L 29/66* (2006.01)

(52) U.S. Cl.
CPC .. *H01L 21/76879* (2013.01); *H01L 21/76885* (2013.01); *H01L 21/76897* (2013.01); *H01L 23/485* (2013.01); *H01L 29/41758* (2013.01); *H01L 29/7833* (2013.01); *H01L 21/76805* (2013.01); *H01L 23/53228* (2013.01); *H01L 23/53257* (2013.01); *H01L 29/665* (2013.01); *H01L 29/7848* (2013.01); *H01L 2924/0002* (2013.01)

(58) Field of Classification Search
CPC ......... H01L 21/76879; H01L 21/76885; H01L 21/76897; H01L 23/485; H01L 23/5226; H01L 23/53228; H01L 23/53257; H01L 29/41758; H01L 29/665; H01L 29/7833; H01L 29/7848; H01L 21/76805
USPC .......................................................... 257/530
See application file for complete search history.

(56) References Cited

U.S. PATENT DOCUMENTS

| | | | |
|---|---|---|---|
| 7,372,164 | B2 | 5/2008 | Hino et al. |
| 7,892,924 | B1 * | 2/2011 | Lee .................... H01L 29/0634 438/268 |
| 7,982,318 | B2 * | 7/2011 | Heo .................. H01L 21/31116 257/741 |
| 8,264,086 | B2 | 9/2012 | Shue et al. |
| 8,754,475 | B2 | 6/2014 | Yamada |
| 2001/0028872 | A1 | 10/2001 | Iwasaki et al. |
| 2003/0179559 | A1 * | 9/2003 | Engelhardt ............ B82Y 10/00 361/780 |
| 2003/0211724 | A1 * | 11/2003 | Haase .................... B82Y 10/00 438/629 |
| 2006/0011972 | A1 * | 1/2006 | Graham ................ B82Y 10/00 257/324 |
| 2007/0045780 | A1 | 3/2007 | Akram |
| 2007/0148963 | A1 | 6/2007 | Chan et al. |
| 2007/0184654 | A1 | 8/2007 | Akram |
| 2009/0072408 | A1 | 3/2009 | Kabir et al. |
| 2009/0085023 | A1 | 4/2009 | Muralidhar |
| 2010/0255674 | A1 * | 10/2010 | Byun ................. H01L 21/76823 438/626 |
| 2012/0091520 | A1 | 4/2012 | Nakamura |
| 2013/0127019 | A1 | 5/2013 | Lee |
| 2013/0258792 | A1 | 10/2013 | Kitano |

FOREIGN PATENT DOCUMENTS

| | | |
|---|---|---|
| JP | 2012-89566 A | 5/2012 |
| JP | 2012-227208 A | 11/2012 |
| KR | 2002-0067664 A | 8/2002 |
| KR | 10-0487948 B1 | 5/2005 |

* cited by examiner

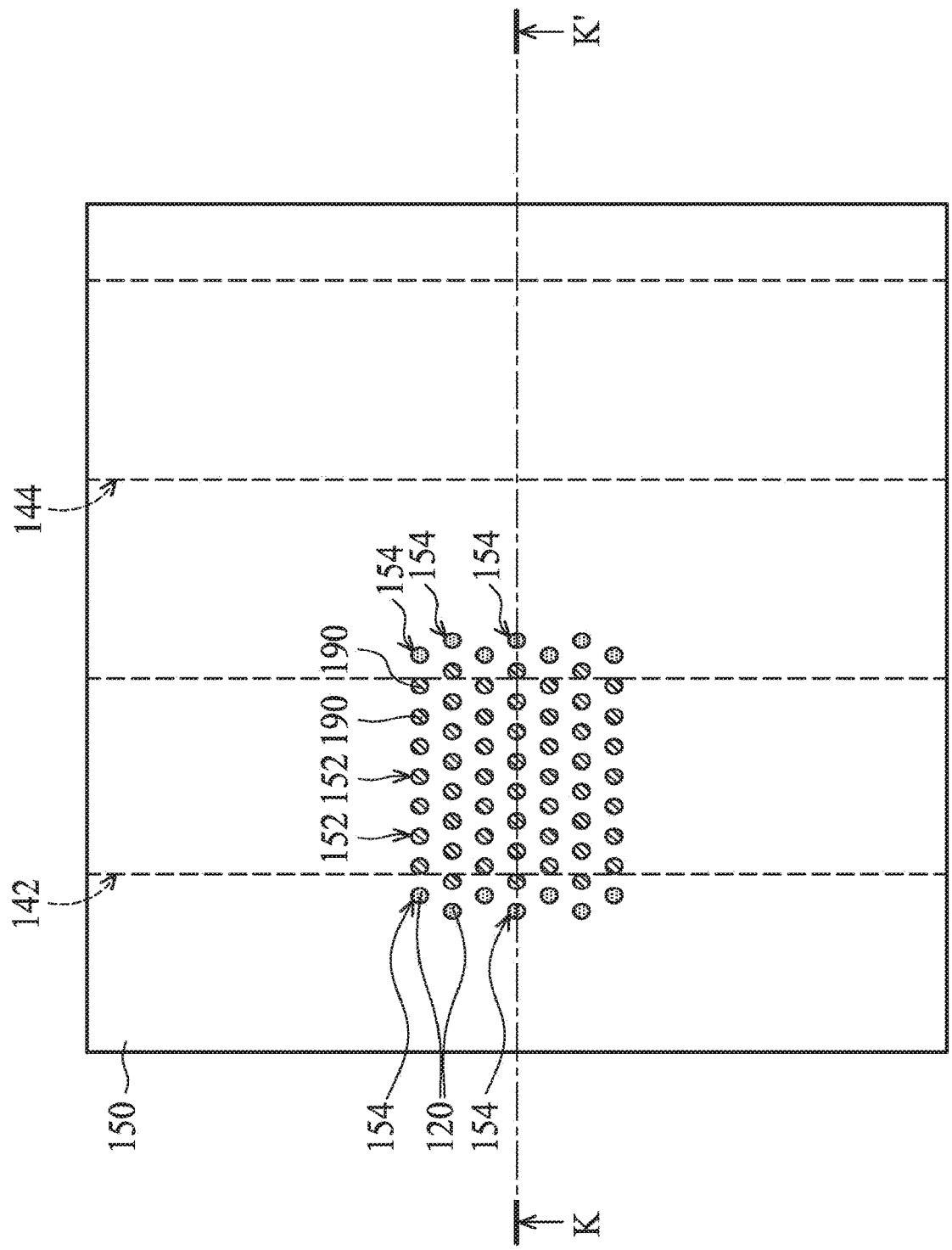

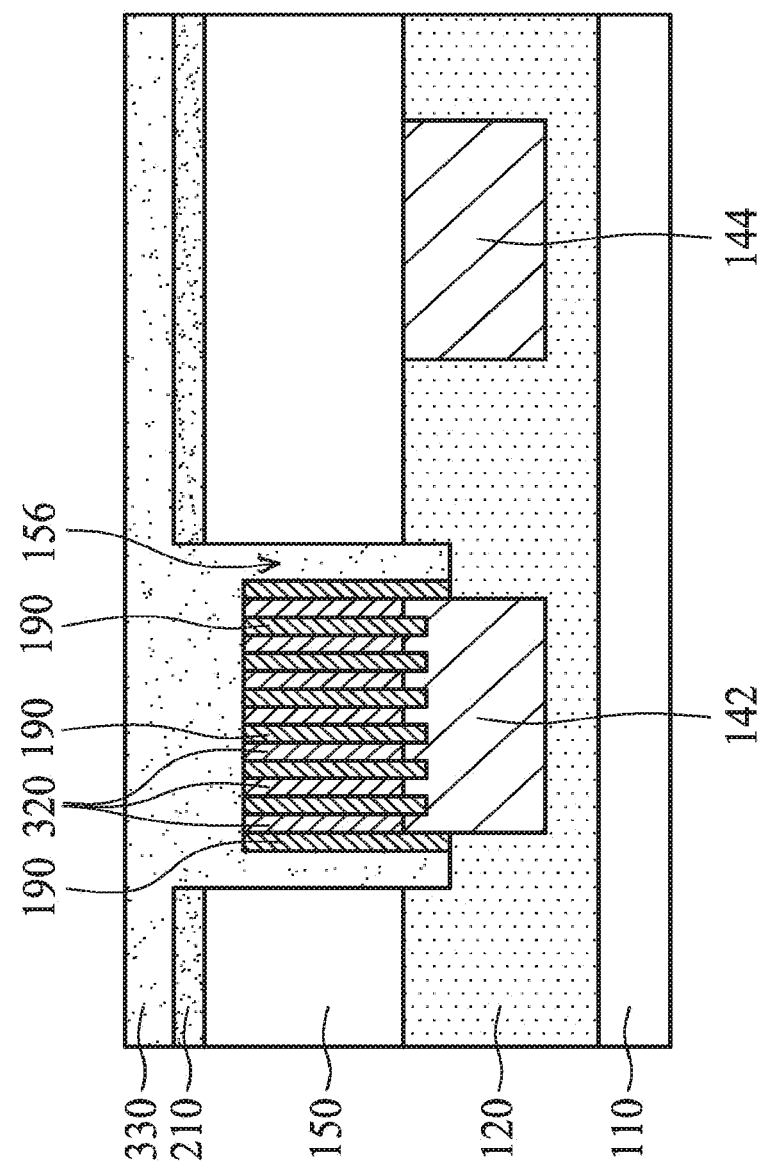

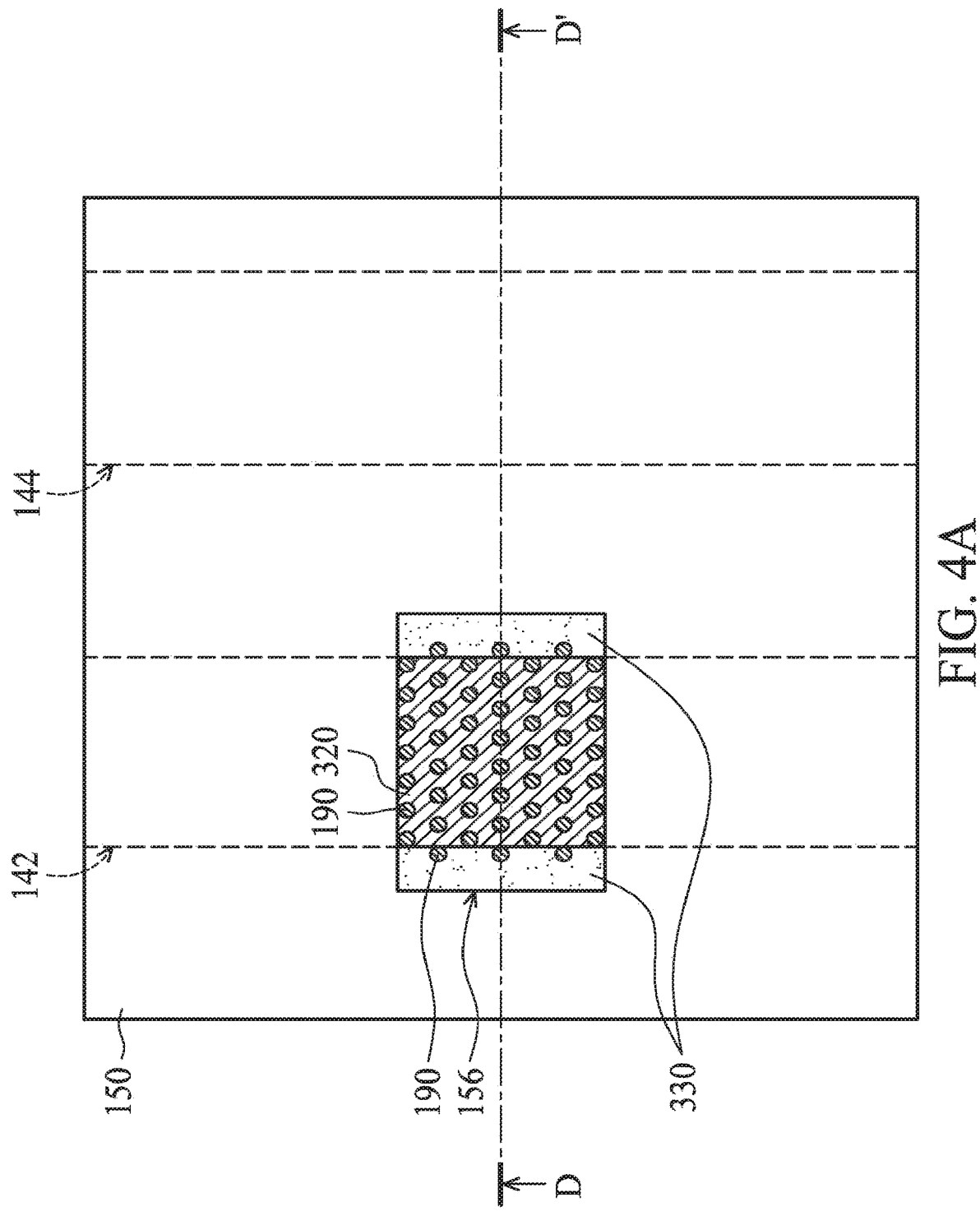

CONDUCTIVE STRUCTURES IN SEMICONDUCTOR DEVICES

CROSS-REFERENCE TO RELATED APPLICATION

This application is a divisional of U.S. Non-Provisional patent application Ser. No. 14/524,228, now U.S. Pat. No. 10,002,826, titled "Semiconductor Device Structure and Method for Forming the Same," which was filed on Oct. 27, 2014 and is incorporated herein by reference in its entirety.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 2C is a top view of the structure of FIG. 1K, in accordance with some embodiments.

FIGS. 3A-3F are cross-sectional views of various stages of a process for forming a semiconductor device structure, in accordance with some embodiments.

FIG. 4A is a top view of the structure of FIG. 3D, in accordance with some embodiments.

DETAILED DESCRIPTION

Figure 1A:
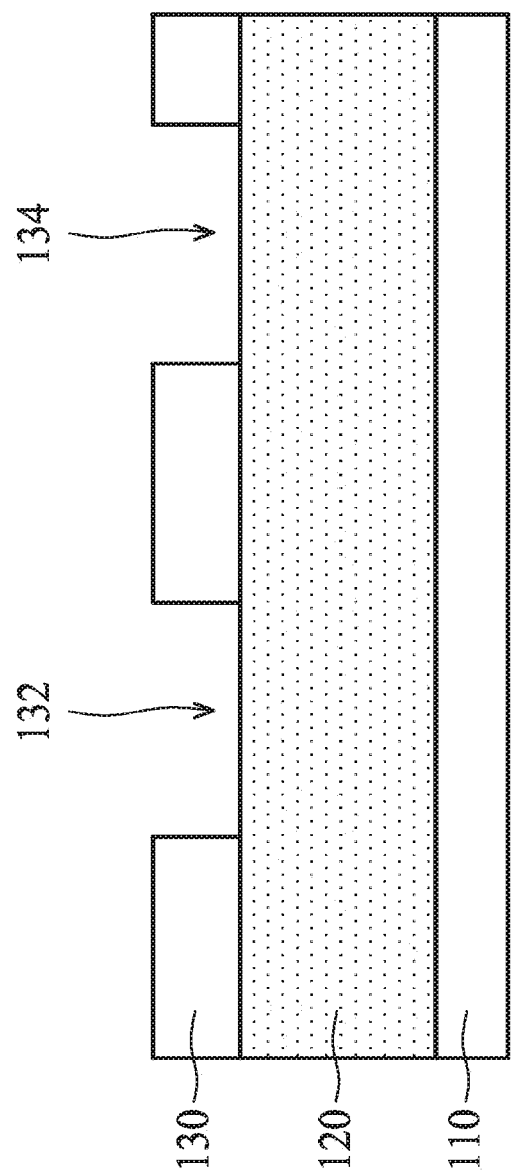
FIGS. 1A-1O are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1O are cross-sectional views of various stages of a process for forming a semiconductor device structure 100, in accordance with some embodiments. As shown in FIG. 1A, a semiconductor substrate 110 is provided, in accordance with some embodiments. The semiconductor substrate 110 is a semiconductor wafer (such as a silicon wafer) or a portion of a semiconductor wafer, in accordance with some embodiments.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

As shown in FIG. 1A, a dielectric layer 120 is deposited over the semiconductor substrate 110, in accordance with some embodiments. The dielectric layer 120 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

The dielectric layer 120 is deposited by any suitable process, such as a CVD process, an HDPCVD process, a spin-on process, a sputtering process, or a combination thereof, in accordance with some embodiments. As shown in FIG. 1A, a mask layer 130 is formed over the dielectric layer 120, in accordance with some embodiments. The mask layer 130 has trenches 132 and 134 exposing the dielectric layer 120, in accordance with some embodiments.

Figure 1B:
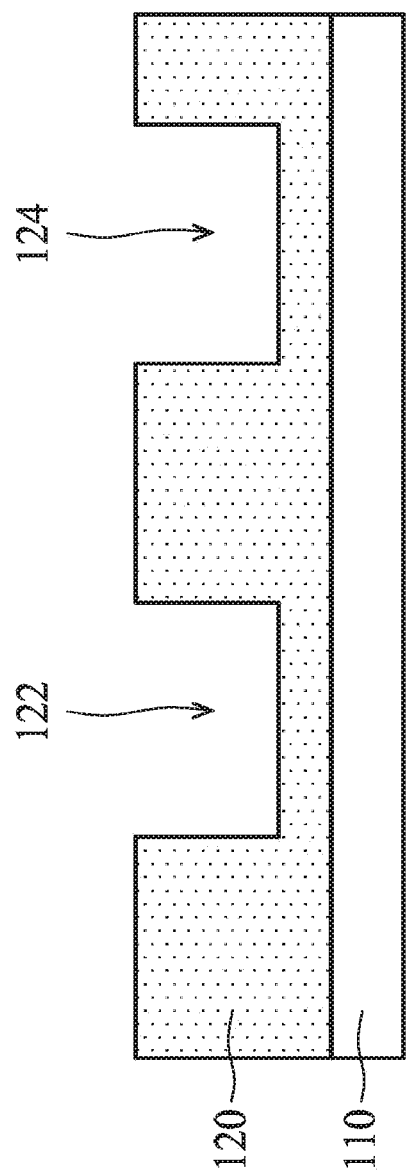

As shown in FIG. 1B, a portion of the dielectric layer 120 is removed through the trenches 132 and 134 to form trenches 122 and 124 in the dielectric layer 120, in accordance with some embodiments. The portion of the dielectric layer 120 is removed by an etching process, in accordance with some embodiments. Thereafter, the mask layer 130 is removed, in accordance with some embodiments.

In some embodiments, a barrier layer (not shown) is formed over sidewalls and bottom surfaces of the trenches 122 and 124. The barrier layer is configured to block the diffusion of metal atoms into the dielectric layer 120, in accordance with some embodiments. In some embodiments, the barrier layer includes titanium, titanium nitrides, tantalum, tantalum nitrides or other suitable materials. In some embodiments, the barrier layer is formed by a physical vapor deposition (PVD) process, a chemical vapor deposition (CVD) process, an electroless plating process, or another suitable process.

In some embodiments, a seed layer (not shown) is formed over the barrier layer. The seed layer includes copper, copper alloys, cobalt (Co), ruthenium (Ru) or other suitable conductive materials, in accordance with some embodiments. In some embodiments, the seed layer is formed by a physical vapor deposition (PVD) process, a chemical vapor deposition (CVD) process, an electroless plating process, or another suitable process.

Figure 1C:
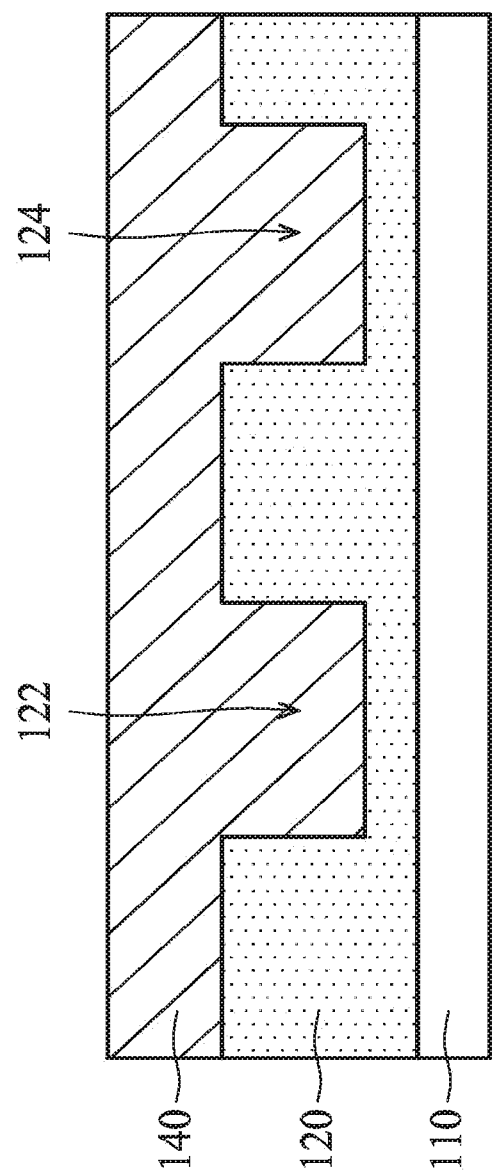

Afterwards, as shown in FIG. 1C, a conductive layer 140 is deposited over the dielectric layer 120 to fill the trenches 122 and 124, in accordance with some embodiments. In some embodiments, the conductive layer 140 is made of any suitable conductive material, such as copper, a copper alloy, silver, gold, or a combination thereof. The conductive layer 140 is deposited by any suitable process, such as an electrochemical plating process.

Figure 1D:
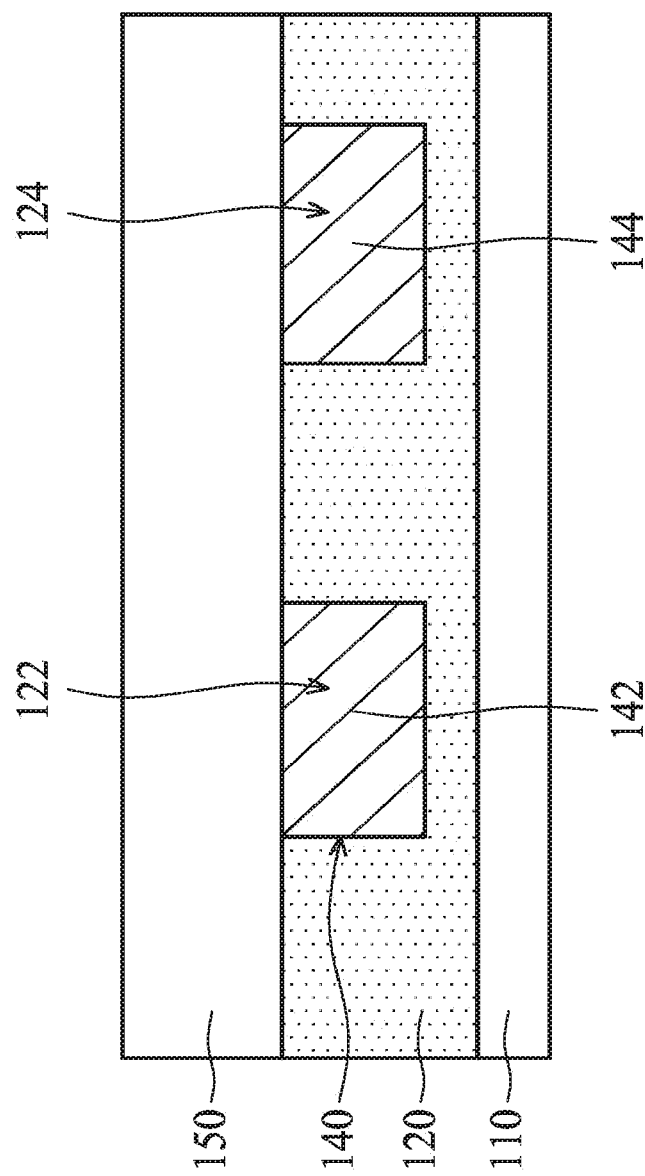

As shown in FIG. 1D, the conductive layer 140 outside of the trenches 122 and 124 is removed, in accordance with some embodiments. In some embodiments, the conductive layer 140 outside of the trenches 122 and 124 is removed by a planarization process (e.g., a chemical mechanical polishing process). After the planarization process, the conductive layer 140 remaining in the trenches 122 and 124 forms conductive lines 142 and 144, in accordance with some embodiments. The conductive lines 142 and 144 are also referred to as conductive structures, in accordance with some embodiments.

As shown in FIG. 1D, a dielectric layer 150 is deposited over the dielectric layer 120 and the conductive lines 142 and 144, in accordance with some embodiments. The dielectric layer 150 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 150 is deposited by any suitable process, such as a CVD process, HDPCVD process, spin-on process, sputtering process, or combinations thereof, in accordance with some embodiments.

Figure 1E:
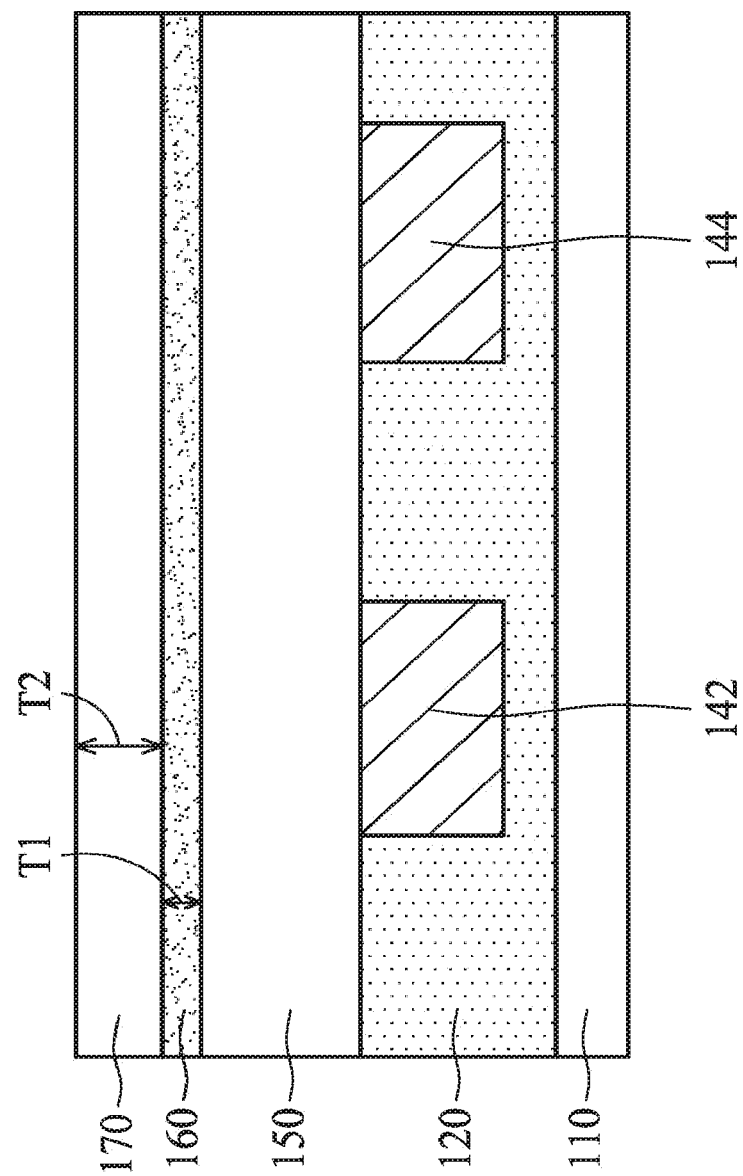

As shown in FIG. 1E, a transfer layer 160 is deposited over the dielectric layer 150, in accordance with some embodiments. In some embodiments, the transfer layer 160 has a thickness T1 ranging from about 50 Å to about 200 Å. The transfer layer 160 includes titanium nitride, silicon nitride, titanium oxide, or another suitable material. The transfer layer 160 is deposited by a chemical vapor deposition process, a physical vapor deposition process, or another suitable deposition process. In some embodiments, the transfer layer 160 is not formed.

As shown in FIG. 1E, a metal layer 170 is formed over the transfer layer 160, in accordance with some embodiments. The metal layer 170 includes aluminum or titanium, in accordance with some embodiments. In some embodiments, the metal layer 170 has a thickness T2 ranging from about 5 nm to about 200 nm. The thickness T2 is greater than the thickness T1, in accordance with some embodiments. In some embodiments, the metal layer 170 is made of an elementary metal material including aluminum or titanium. The metal layer 170 is formed by a physical vapor deposition process, a chemical vapor deposition process, or another suitable deposition process.

Figure 1F:
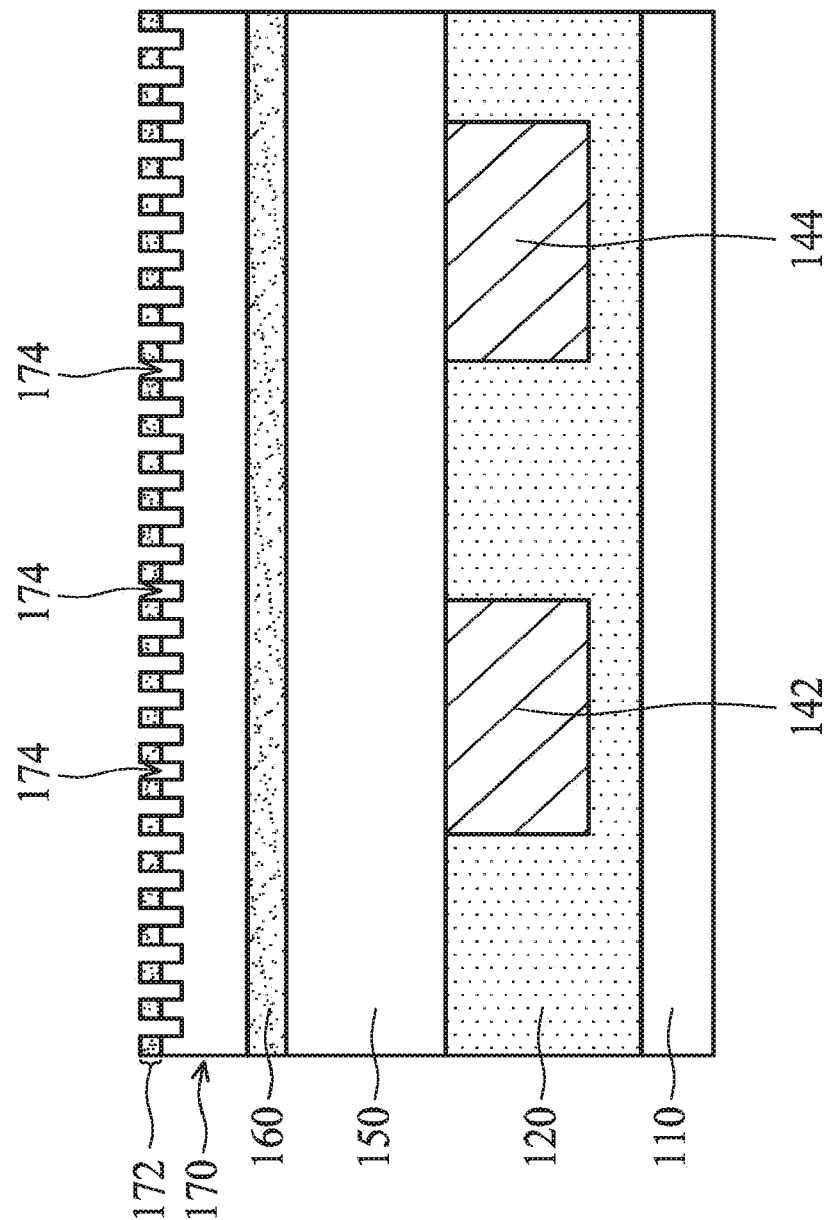

As shown in FIG. 1F, a first anodic oxidation process is performed on the metal layer 170 to oxidize a portion 172 of the metal layer 170, in accordance with some embodiments. After the first anodic oxidation process, recesses 174 are formed in the metal layer 170, in accordance with some embodiments.

The first anodic oxidation process is performed at an applied voltage of about 20 volts to about 60 volts, in accordance with some embodiments. The first anodic oxidation process is performed at about 0° C. to about 30° C., in accordance with some embodiments. The solution used in the first anodic oxidation process includes oxalic acid, in accordance with some embodiments.

Figure 1G:
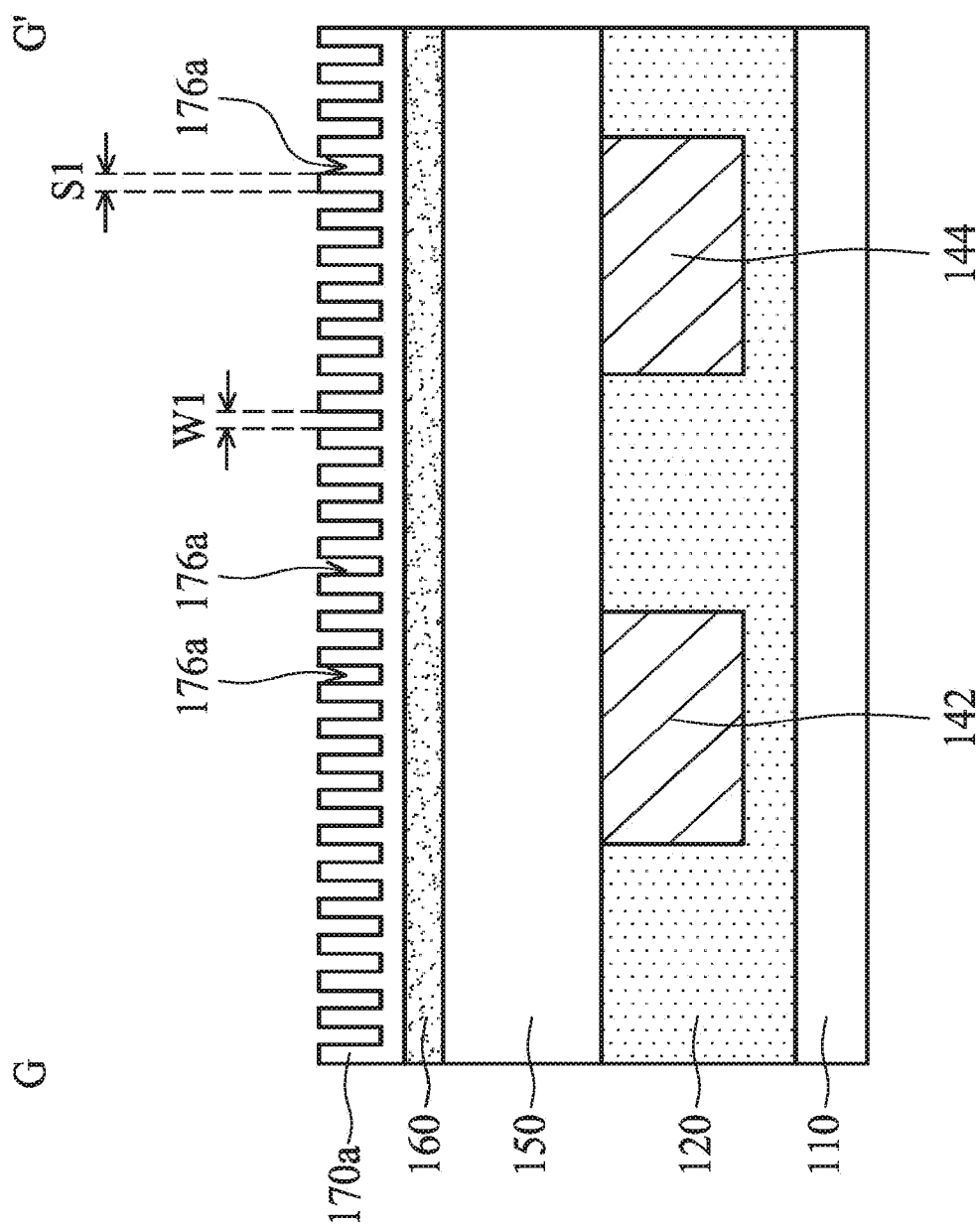

As shown in FIG. 1G, the oxidized portion 172 is removed, in accordance with some embodiments. In some embodiments, the oxidized portion 172 is removed by an wet etching process. In some embodiments, an etching solution used in the wet etching process includes from about 5 to about 10 weight percent of phosphoric acid ($H_3PO_4$) and from about 0.5 to about 2 weight percent of chromium oxide ($CrO_3$).

As shown in FIG. 1G, a second anodic oxidation process is performed on the metal layer 170 to oxidize the metal layer 170 into a mask layer 170a, in accordance with some embodiments. The second anodic oxidation process is performed at an applied voltage of about 0.1 to about 10 volts, in accordance with some embodiments. The second anodic oxidation process is performed at about 0° C. to about 30° C., in accordance with some embodiments. The solution used in the second anodic oxidation process includes oxalic acid, in accordance with some embodiments.

In some embodiments, the mask layer 170a includes aluminum oxide or titanium oxide. In some embodiments, the mask layer 170a has an un-oxidized portion, and therefore the mask layer 170a includes an elementary metal material including aluminum or titanium.

After the second anodic oxidation process, holes 176a are formed in the mask layer 170a, in accordance with some embodiments. The holes 176a are deeper than the recesses 174 (as shown in FIG. 1F), in accordance with some embodiments. The holes 176a do not pass through the mask layer 170a, in accordance with some embodiments. That is, the holes 176a are blind holes.

Figure 2A:
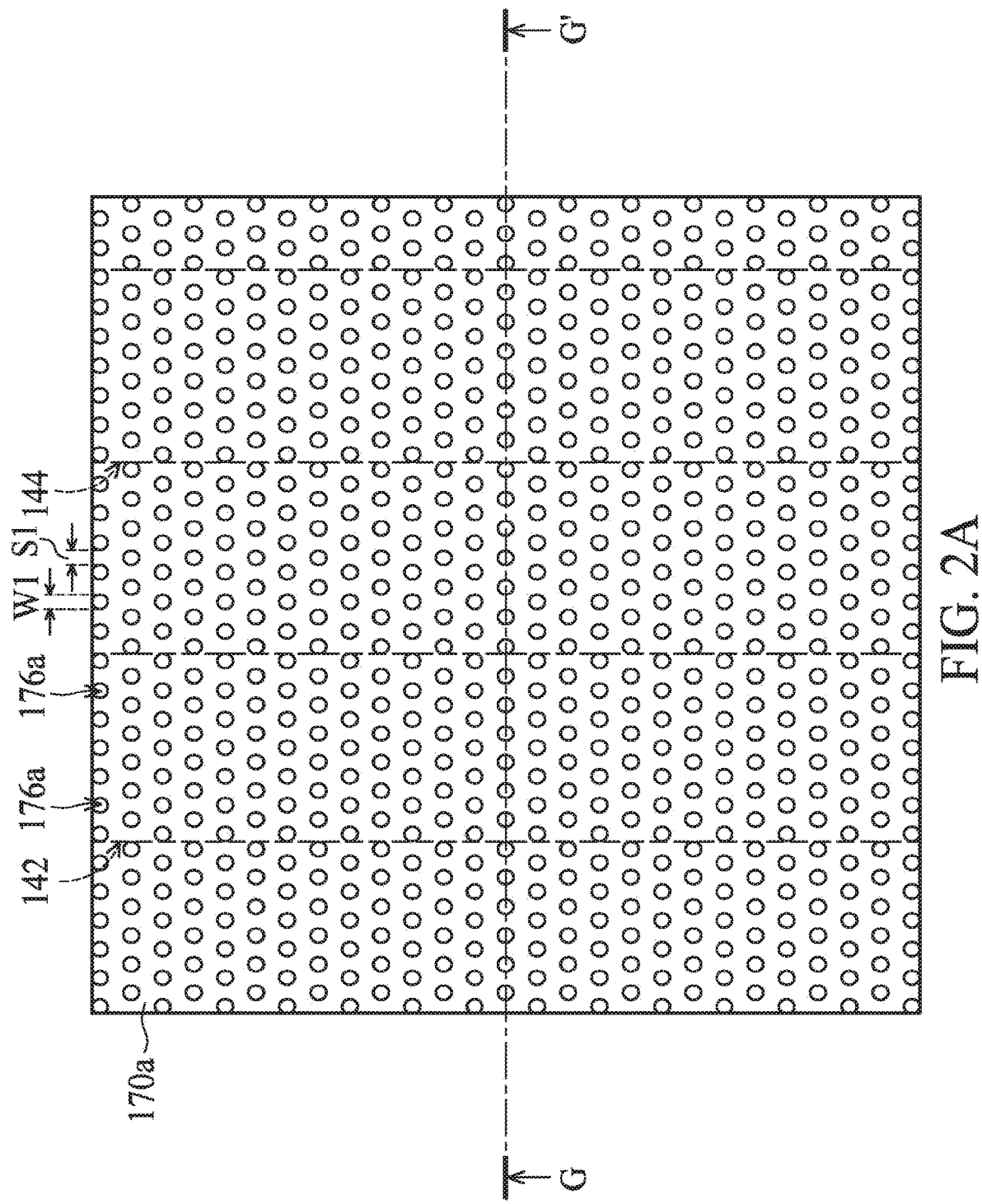
FIG. 2A is a top view of the structure of FIG. 1G, in accordance with some embodiments.

FIG. 2A is a top view of the structure of FIG. 1G, in accordance with some embodiments. FIG. 1G is a cross-sectional view illustrating the structure along sectional line G-G' in FIG. 2A, in accordance with some embodiments.

As shown in FIGS. 1G and 2A, the holes 176a are arranged in an array, in accordance with some embodiments. The holes 176a are spaced apart from each other at substantially the same spacing, in accordance with some embodiments. In some other embodiments, the holes 176a are spaced apart from each other at different spacings.

The spacing S1 between adjacent ones of the holes 176a ranges from about 0.2 nm to about 30 nm, in accordance with some embodiments. The hole 176a has a width W1 raging from about 1 nm to about 30 nm, in accordance with some embodiments. The width W1 may be adjusted depending on requirements. The width W1 may be adjusted by adjusting the applied voltage during the second anodic oxidation process. The smaller the applied voltage is, the smaller the width W1 is. The greater the applied voltage is, the greater the width W1 is.

Figure 1H:
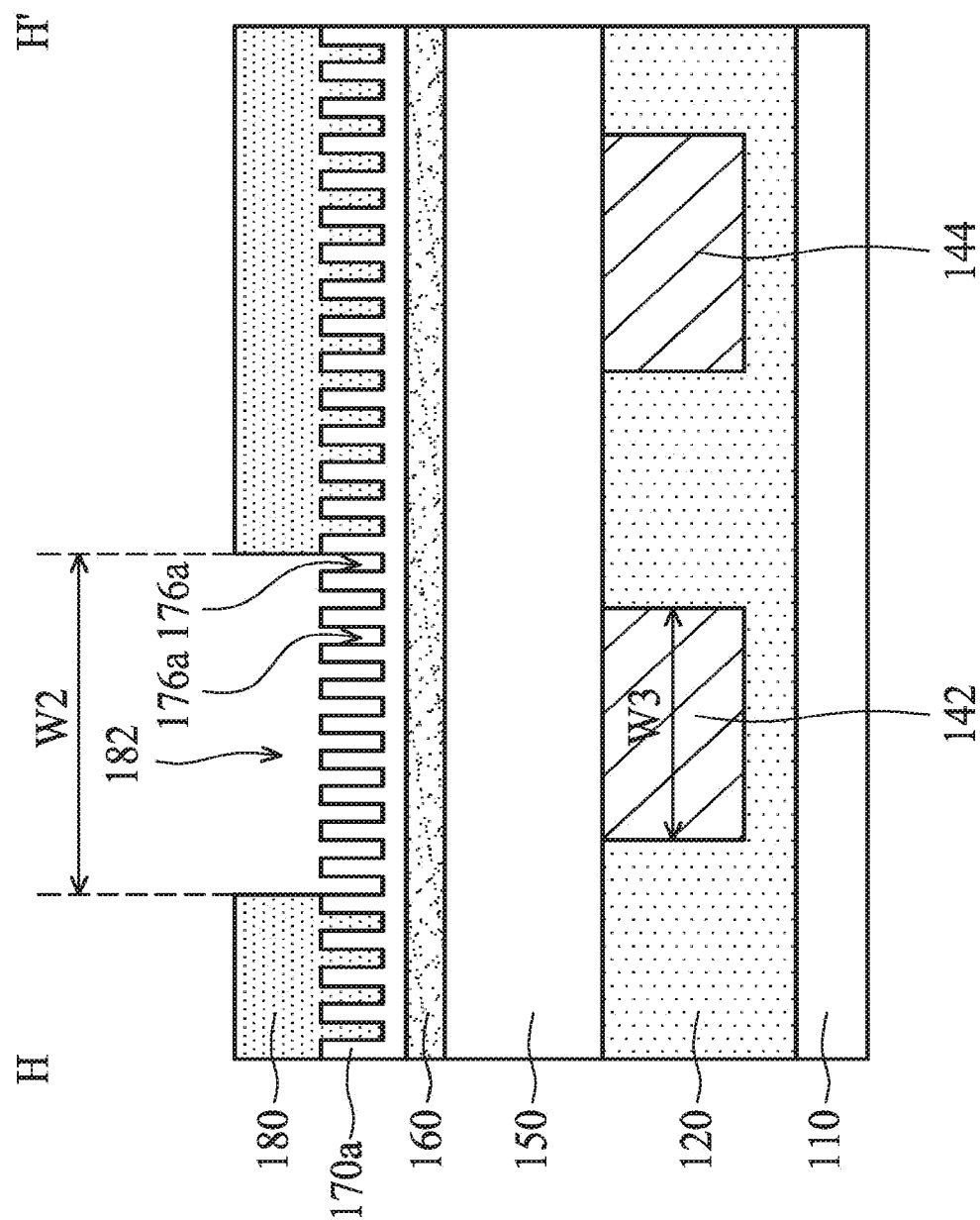
Figure 2B:
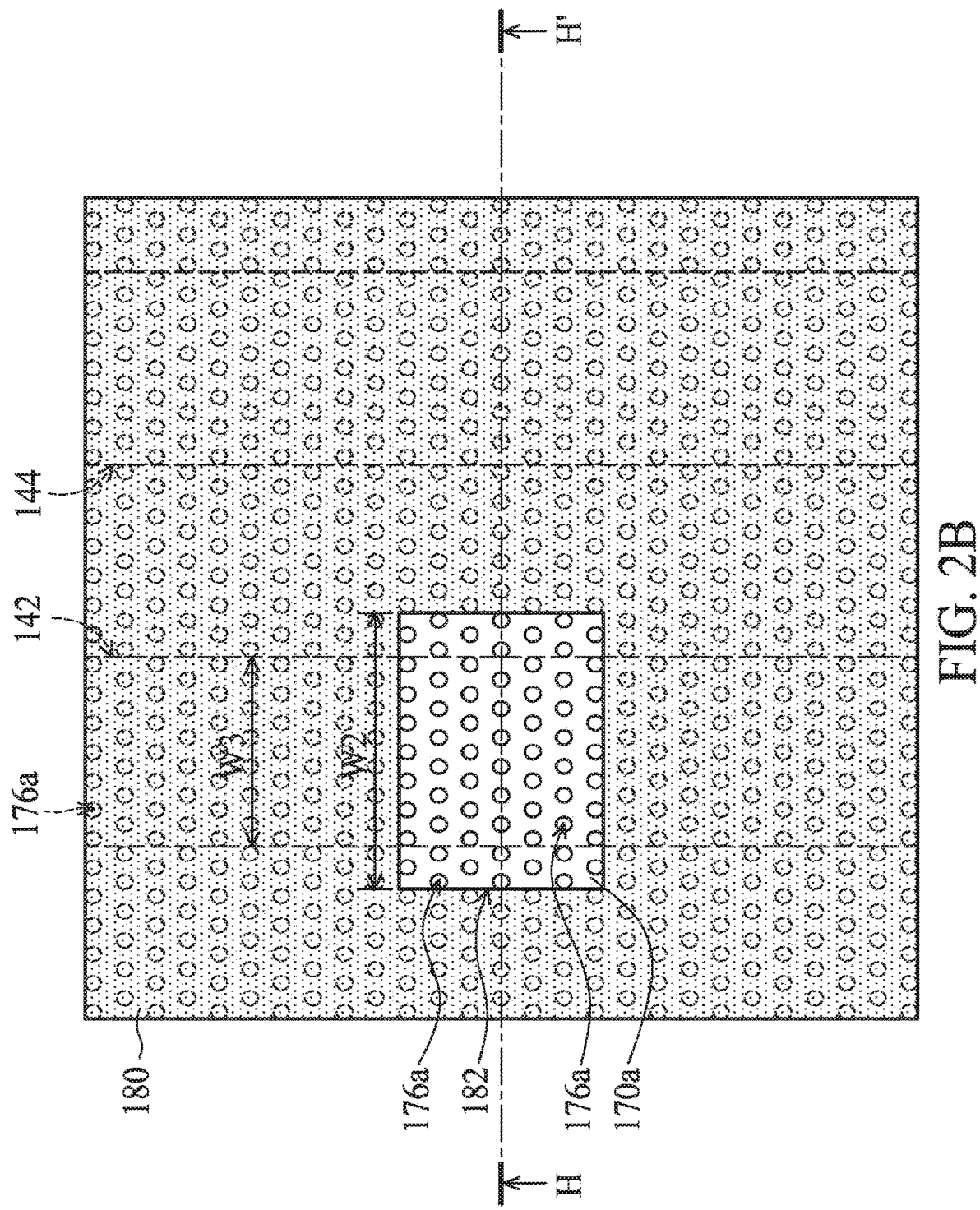
FIG. 2B is a top view of the structure of FIG. 1H, in accordance with some embodiments.

FIG. 2B is a top view of the structure of FIG. 1H, in accordance with some embodiments. FIG. 1H is a cross-sectional view illustrating the structure along sectional line H-H' in FIG. 2B, in accordance with some embodiments.

As shown in FIGS. 1H and 2B, a mask layer 180 is formed over the mask layer 170a to cover the holes 176a, in accordance with some embodiments. The mask layer 180 has an opening 182 exposing the holes 176a over the conductive line 142, in accordance with some embodiments. The opening 182 is above a portion of the conductive line 142, in accordance with some embodiments.

The opening 182 has a width W2, in accordance with some embodiments. In some embodiments, the width W2 is greater than a width W3 of the conductive line 142. Therefore, the opening 182 further exposes the holes 176a adjacent to the conductive line 142 but not right above the conductive line 142, in accordance with some embodiments.

In some embodiments, a ratio of the width W2 to the width W3 ranges from about 1.1 to about 2. In some embodiments, the ratio of the width W2 to the width W3 ranges from about 1.5 to about 2. The mask layer 180 includes a photoresist material or another suitable material. The mask layer 180 is formed by a photolithography process or another suitable process.

Figure 1I:
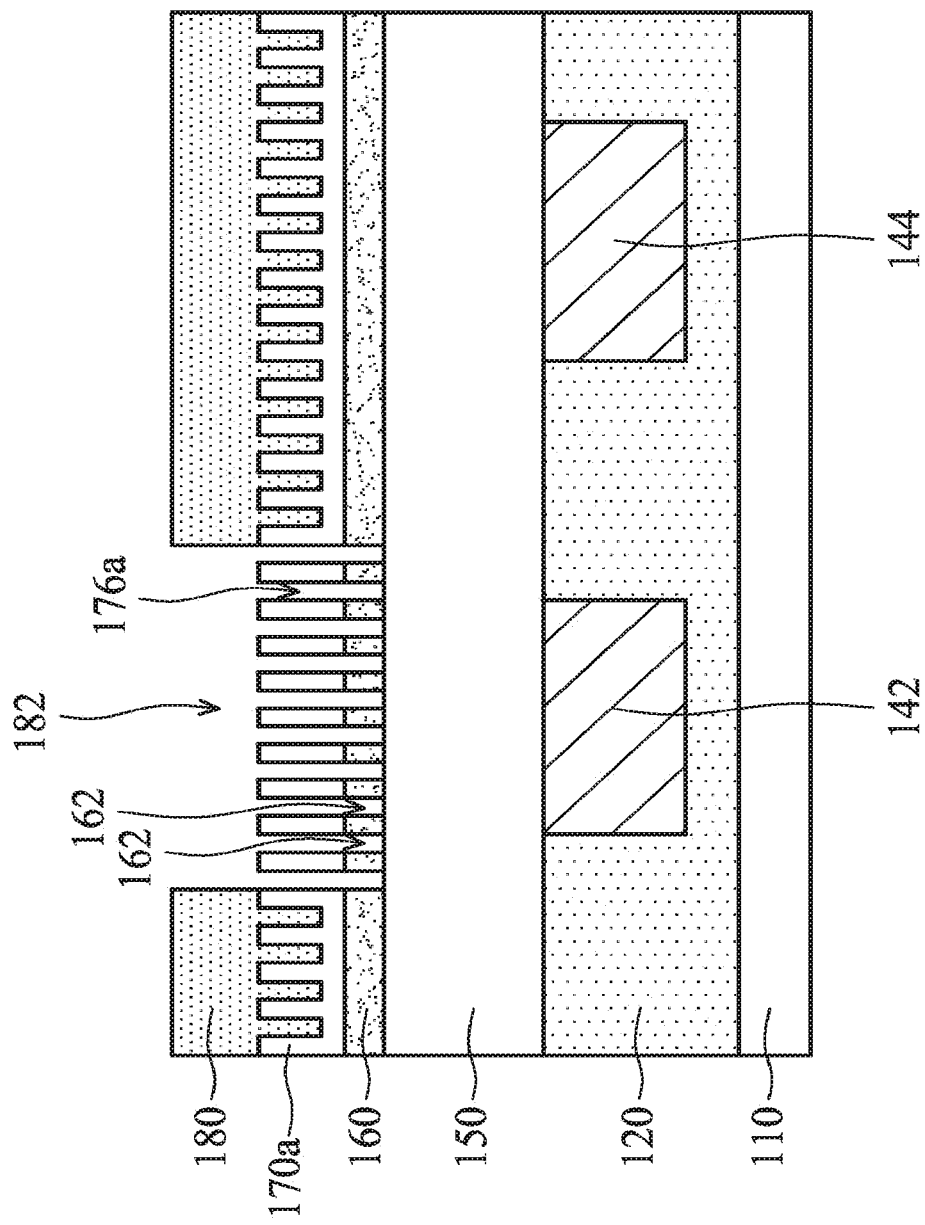

As shown in FIG. 1I, a portion of the mask layer 170a under the holes 176a exposed by the opening 182 is removed, in accordance with some embodiments. The transfer layer 160 under the holes 176a exposed by the opening 182 is removed through the holes 176a, in accordance with some embodiments.

The portions of the mask layer 170a and the transfer layer 160 under the holes 176a exposed by the opening 182 are removed in the same step or in different steps. After the removal process, through holes 162 are formed in the transfer layer 160 to expose the dielectric layer 150, in accordance with some embodiments. The removal process includes a dry etching process or another suitable process.

Figure 1J:
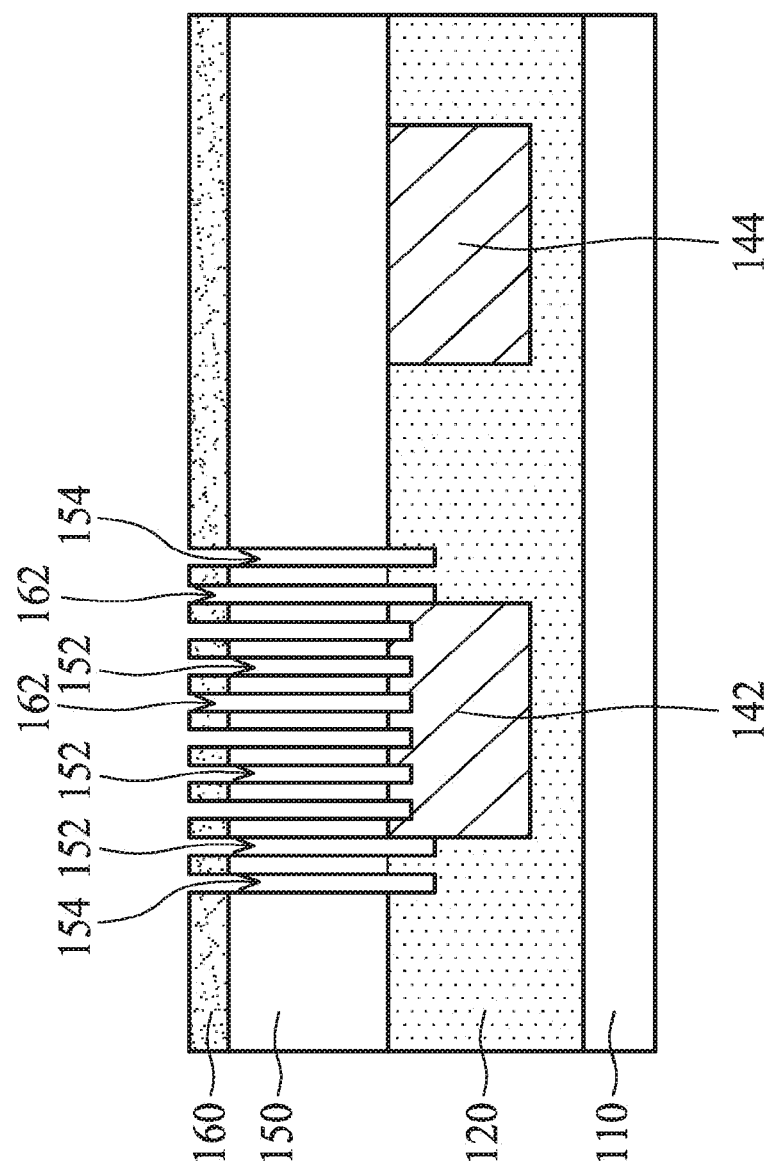

As shown in FIG. 1J, the mask layers 170a and 180 are removed, in accordance with some embodiments. The removal process includes a wet etching process, a dry etching process, or another suitable process. Thereafter, the dielectric layer 150 under the through holes 162 is removed through the through holes 162, in accordance with some embodiments. After the removal of the dielectric layer 150 under the through holes 162, through holes 152 and 154 are formed in the dielectric layer 150, in accordance with some embodiments.

In some embodiments, the through holes 152 expose the conductive line 142 or expose both the conductive line 142 and the dielectric layer 120. In some embodiments, the through holes 154 expose only the dielectric layer 120. The through holes 154 are positioned at two opposite sides of the conductive line 142, in accordance with some embodiments. The dielectric layer 150 under the through holes 162 is removed by a dry etching process, in accordance with some embodiments.

Figure 1K:
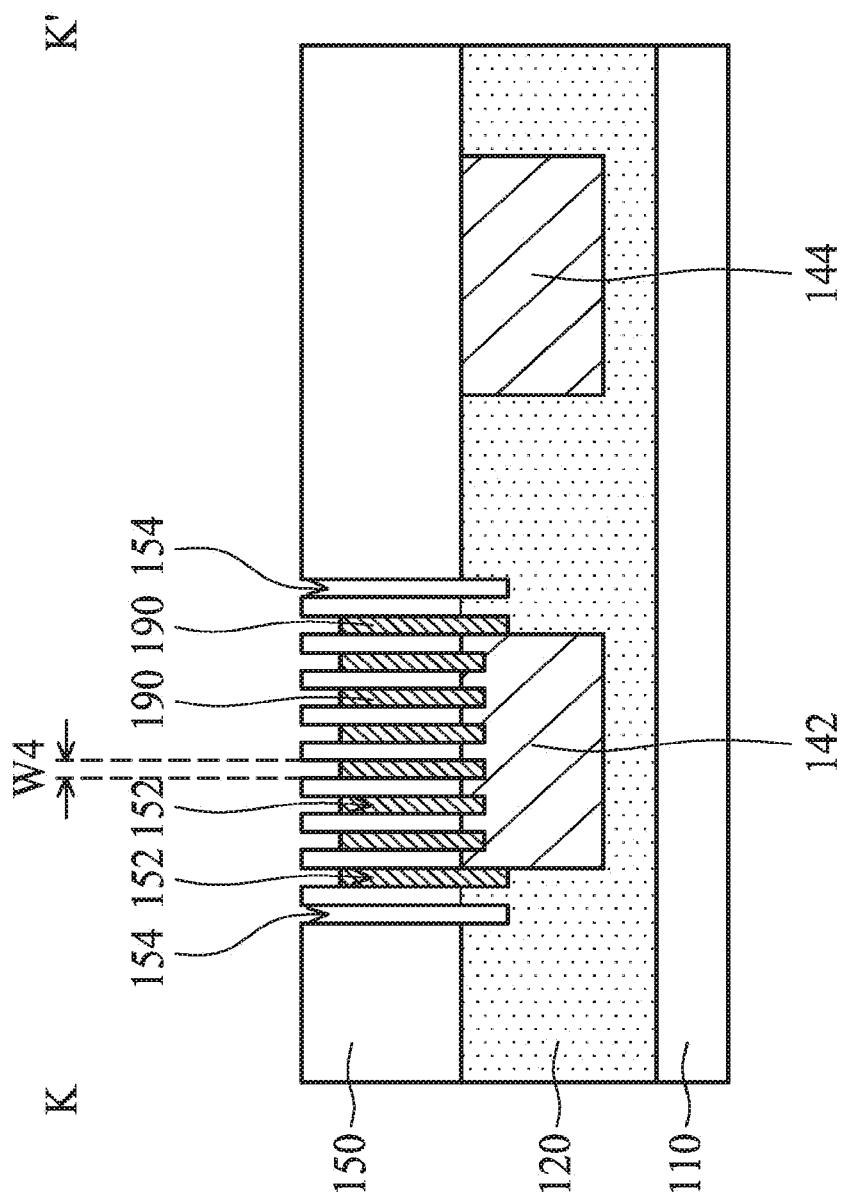

FIG. 2C is a top view of the structure of FIG. 1K, in accordance with some embodiments. FIG. 1K is a cross-sectional view illustrating the structure along sectional line K-K' in FIG. 2C, in accordance with some embodiments.

As shown in FIGS. 1K and 2C, the transfer layer 160 is removed, in accordance with some embodiments. The transfer layer 160 is removed by a wet etching process or a dry etching process, in accordance with some embodiments. As shown in FIGS. 1K and 2C, conductive pillars 190 are formed in the through holes 152, in accordance with some embodiments.

In some embodiments, the conductive pillar 190 partially fills the through hole 152. In some other embodiments (not shown), the conductive pillar 190 completely fills the through hole 152. The conductive pillars 190 include tungsten (W), titanium (Ti), cobalt (Co), and/or copper, in accordance with some embodiments.

The conductive pillars 190 are formed by a selective deposition process, in accordance with some embodiments. The selective deposition process includes a chemical vapor deposition process, an atomic layer deposition process, or an electroless plating process, in accordance with some embodiments.

The selective deposition process deposits a conductive material only on a conductive structure and not on a dielectric structure, in accordance with some embodiments. Therefore, the selective deposition process deposits the conductive pillars 190 only on the conductive line 142 and not on the dielectric layer 120, in accordance with some embodiments. The conductive pillars 190 are substantially self-aligned with the conductive line 142. As a result, the conductive pillars 190 are not formed in the through holes 154, in accordance with some embodiments. Therefore, the through holes 154 are empty, in accordance with some embodiments.

According to the above description, even if the width W2 of the opening 182 of the mask layer 180 (as shown in FIG. 1H) is greater than the width W3 of the conductive line 142, the conductive pillars 190 are substantially self-aligned with the conductive line 142 due to the selective deposition process. Therefore, the selective deposition process may prevent any short circuits between the conductive lines 142 and 144, in accordance with some embodiments.

As a result, the overlap shift margin (tolerance) between the opening 182 of the mask layer 180 and the conductive line 142 is enlarged. There is no need to form a high-grade mask layer, which effectively reduces the manufacturing difficulty and the manufacturing cost of the mask layer 180, in accordance with some embodiments.

The through hole 152 (or 154) has a width W4, in accordance with some embodiments. The width W4 is in a range from about 1 nm to about 30 nm, in accordance with some embodiments. The selective deposition process forms the conductive pillars 190 from the surface of the conductive line 142, in accordance with some embodiments. The conductive pillars 190 are able to be formed in the through holes 152 as long as the deposition gas or the electrolyte used in the selective deposition process is able to flow into the through holes 152.

As a result, the conductive pillars 190 may be formed in the through holes 152 with a high aspect ratio. In some embodiments, the aspect ratio of the through hole 152 is in a range from about 10 to about 15. In some embodiments, the width W4 is greater than 3 nm, and the aspect ratio of the through hole 152 is in a range from about 10 to about 15.

Figure 1L:
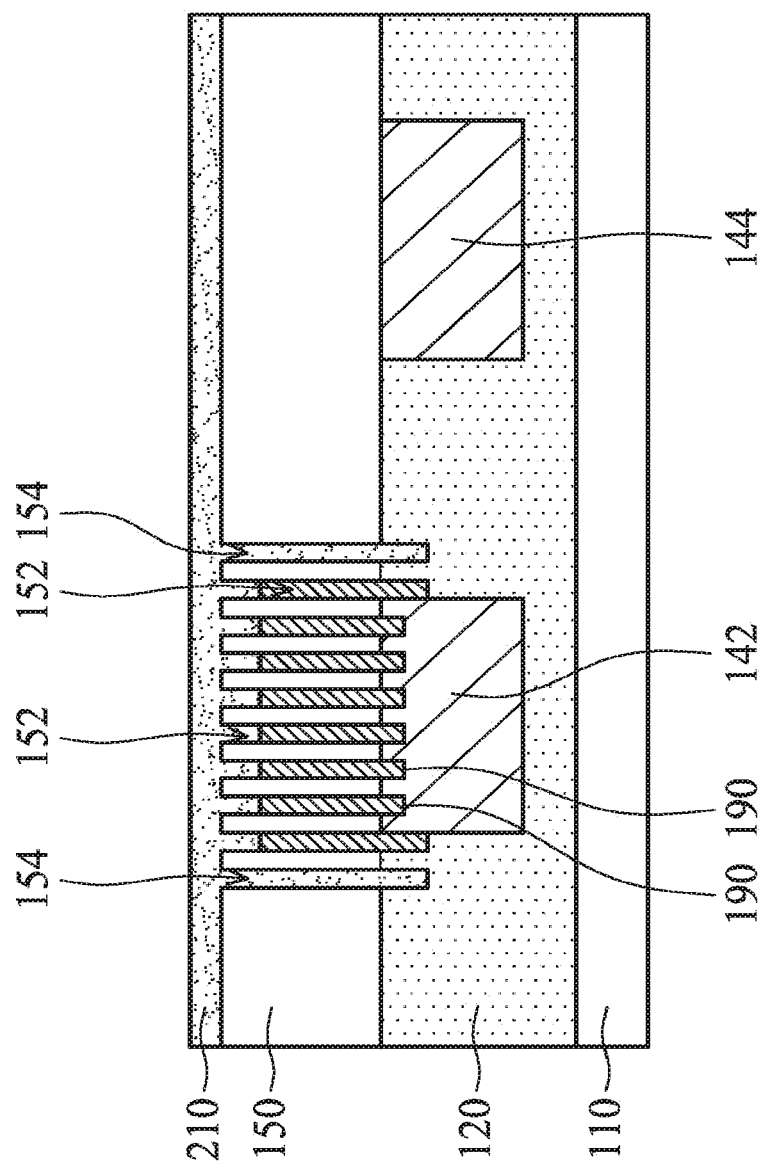

As shown in FIG. 1L, an insulating layer 210 is deposited over the dielectric layer 150, in accordance with some embodiments. The insulating layer 210 is configured to fill the through holes 152 and 154, in accordance with some embodiments. The insulating layer 210 includes silicon oxide or other suitable insulating materials. The insulating layer 210 is formed by a spin coating process or another suitable process.

Figure 1M:
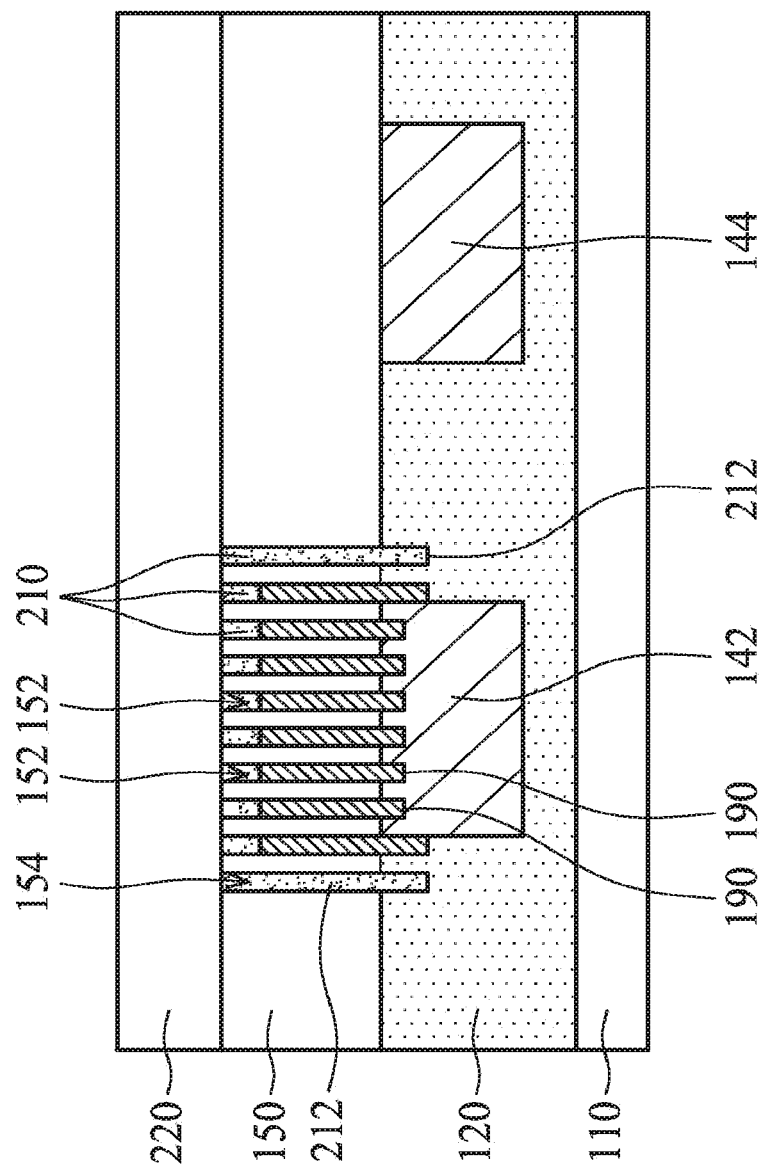

As shown in FIG. 1M, the insulating layer 210 outside of the through holes 152 and 154 are removed, in accordance with some embodiments. In some embodiments, the insulating layer 210 outside of the through holes 152 and 154 are removed by a planarization process. The planarization process includes a chemical mechanical polishing (CMP) process, in accordance with some embodiments.

After the planarization process, the insulating layer 210 remaining in the through holes 154 forms insulating pillars 212, in accordance with some embodiments. The insulating pillars 212 pass through the dielectric layer 150 and are adjacent to the conductive pillars 190, in accordance with some embodiments.

As shown in FIG. 1M, a dielectric layer 220 is deposited over the dielectric layer 150, the conductive pillars 190, and the insulating pillars 212, in accordance with some embodiments. The dielectric layer 220 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 220 is deposited by any suitable process, such as a CVD process, an HDPCVD process, a spin-on process, a sputtering process, or a combination thereof, in accordance with some embodiments.

Figure 1N:
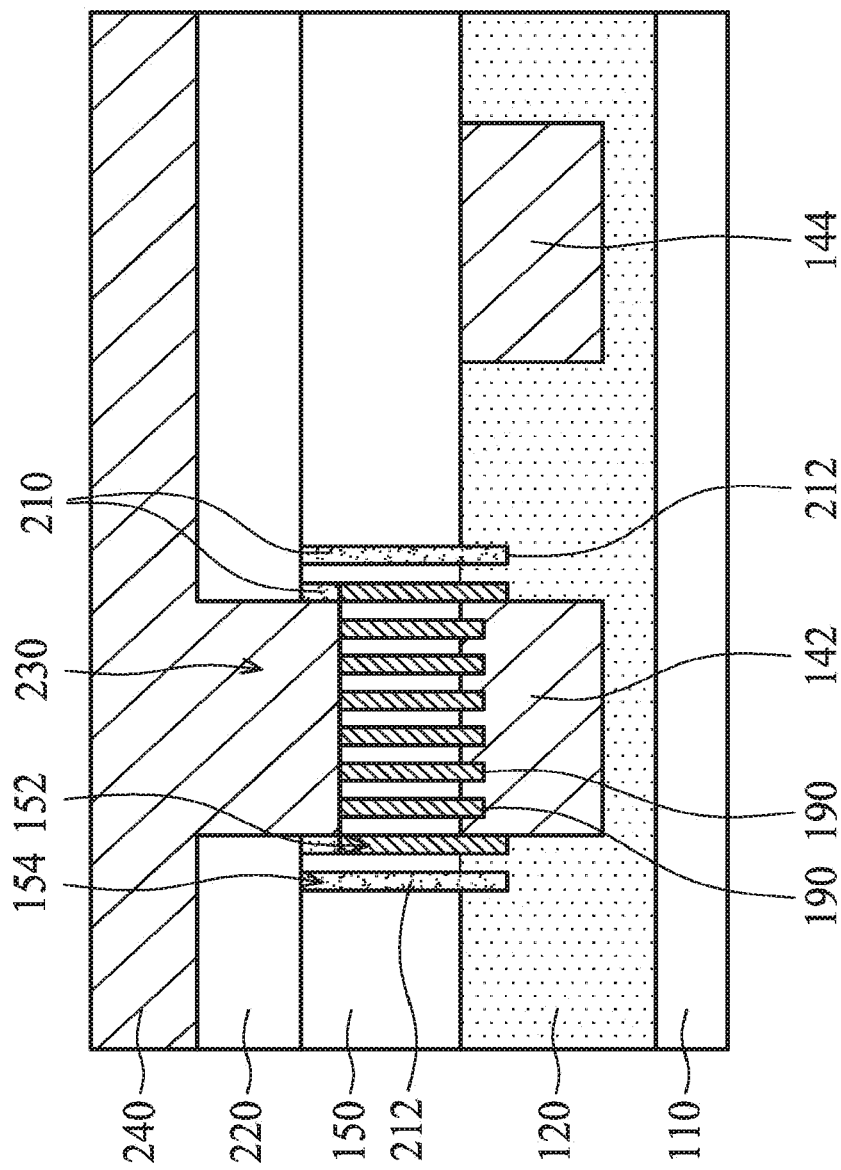
Figure 10:
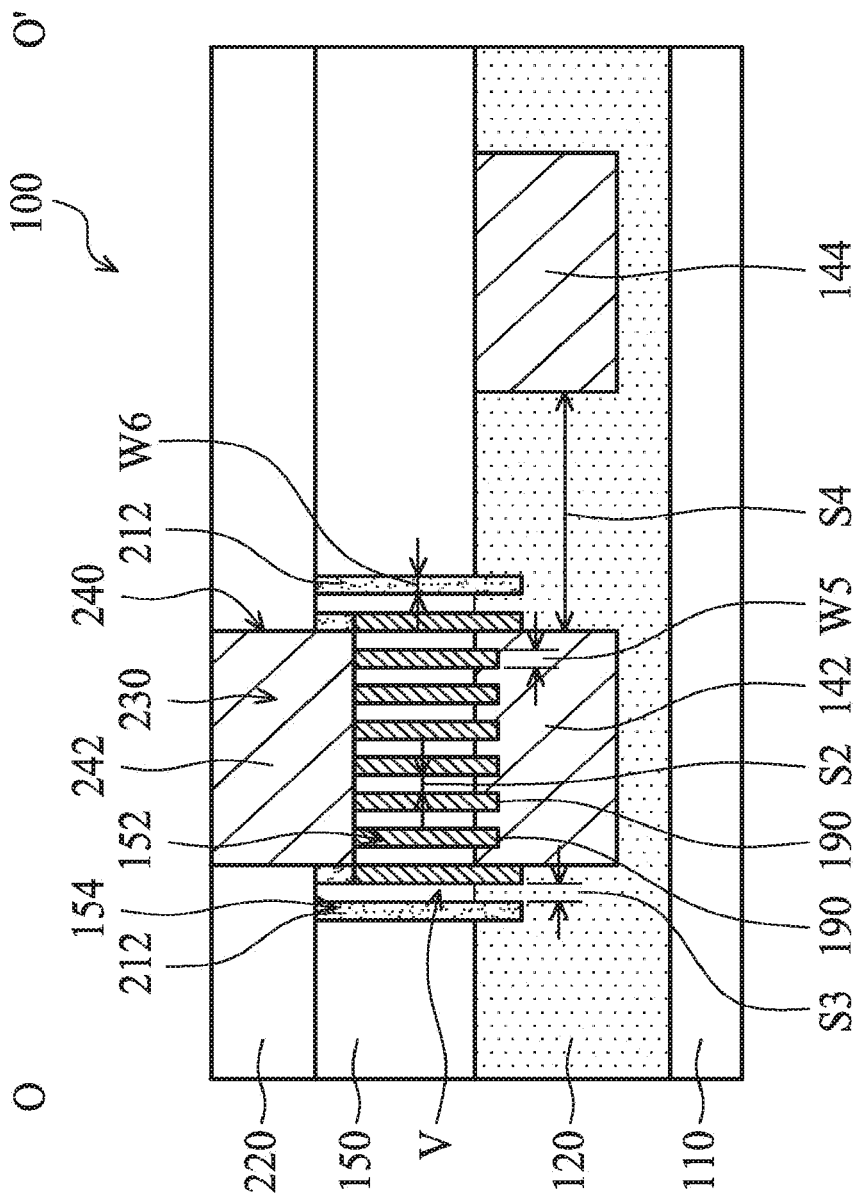

As shown in FIG. 1N, a trench 230 is formed in the dielectric layer 220, in accordance with some embodiments. The trench 230 passes through the dielectric layer 220 and the insulating layer 210 remaining in the through holes 152, in accordance with some embodiments. The trench 230 exposes the conductive pillars 190, in accordance with some embodiments. The trench 230 is formed by a photolithography process and an etching process, in accordance with some embodiments.

As shown in FIG. 1N, a conductive layer 240 is deposited over the dielectric layer 220 to fill the trench 230, in accordance with some embodiments. In some embodiments, the conductive layer 240 is made of any suitable conductive material, such as copper, a copper alloy, silver, gold, or a combination thereof. The conductive layer 240 is deposited by any suitable process, such as an electrochemical plating process.

Figure 2D:
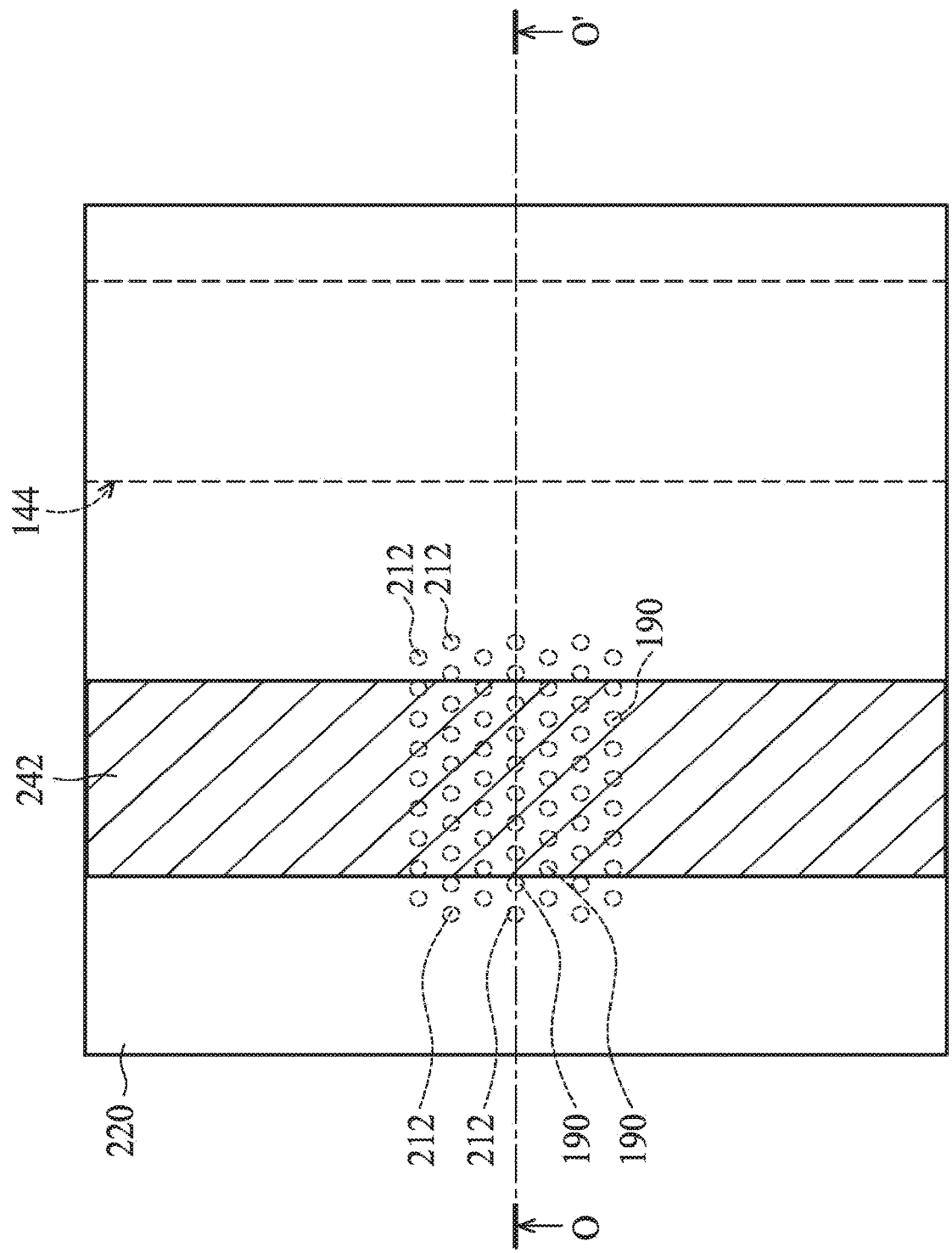
FIG. 2D is a top view of the structure of FIG. 1O, in accordance with some embodiments.

FIG. 2D is a top view of the structure of FIG. 1O, in accordance with some embodiments. FIG. 1O is a cross-sectional view illustrating the structure along sectional line O-O' in FIG. 2D, in accordance with some embodiments.

As shown in FIGS. 1O and 2D, the conductive layer 240 outside of the trench 230 is removed, in accordance with some embodiments. In some embodiments, the conductive layer 240 outside of the trench 230 is removed by a planarization process (e.g., a chemical mechanical polishing process). After the planarization process, the conductive layer 240 remaining in the trench 230 forms a conductive line 242, in accordance with some embodiments. The conductive line 242 is also referred to as a conductive structure, in accordance with some embodiments.

The conductive pillars 190 pass through the dielectric layer 150, in accordance with some embodiments. The conductive line 242 is electrically connected with the conductive pillars 190, in accordance with some embodiments. The conductive pillars 190 electrically connect the conductive line 242 to the conductive line 142, in accordance with some embodiments. The conductive pillars 190 together form a conductive via structure V, in accordance with some embodiments.

As shown in FIGS. 1O and 2D, in this step, a semiconductor device structure 100 is substantially formed, in accordance with some embodiments. The conductive lines 142 and 144 are embedded in the dielectric layer 120, in accordance with some embodiments. Each of the conductive pillars 190 has a width W5 raging from about 1 nm to about 30 nm.

The conductive pillars 190 are spaced apart from each other, in accordance with some embodiments. In some embodiments, the conductive pillars 190 are spaced apart from each other at a substantially same spacing. The spacing S2 between the conductive pillars 190 ranges from about 0.2 nm to about 30 nm, in accordance with some embodiments. The spacing S2 may be maintain in a suitable range. If the spacing S2 is too large, the contact area between the conductive via structure V and the conductive line 142 (or the conductive line 242) is too small, which may increase the contact resistance. A ratio of the width W5 to the spacing S2 between adjacent conductive pillars 190 ranges from about 1 to about 5, in accordance with some embodiments.

The through holes 152 further penetrate into the conductive line 142, and therefore the conductive pillars 190 are partially inserted into the conductive line 142, in accordance with some embodiments. The through holes 154 further penetrate into the dielectric layer 120, and therefore the insulating pillars 212 are partially inserted into the dielectric layer 120, in accordance with some embodiments.

The insulating pillars 212 are positioned at two opposite sides of the conductive line 142, in accordance with some embodiments. The conductive pillars 190 and the insulating pillars 212 are spaced apart from each other at a substantially same spacing, in accordance with some embodiments. The spacing S3 between the conductive pillar 190 and the insulating pillar 212 ranges from about 0.2 nm to about 30 nm, in accordance with some embodiments.

The insulating pillar 212 has a width W6 ranging from about 1 nm to about 30 nm, in accordance with some embodiments. A spacing S4 between the conductive lines 142 and 144 ranges from about 4 nm to about 50 nm, in accordance with some embodiments.

Figure 3A:
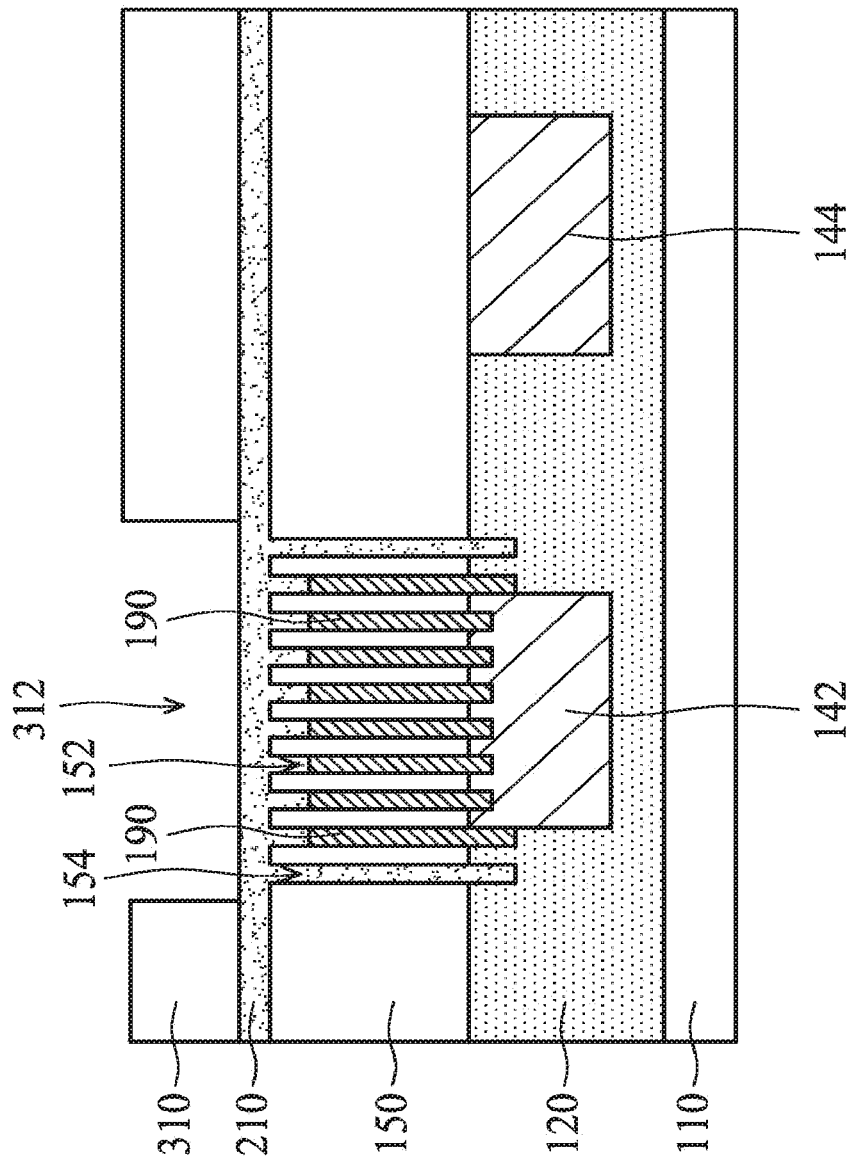

FIGS. 3A-3F are cross-sectional views of various stages of a process for forming a semiconductor device structure 300, in accordance with some embodiments. As shown in FIG. 3A, after the steps of FIGS. 1A-1L, a mask layer 310 is formed over the insulating layer 210, in accordance with some embodiments. The mask layer 310 has an opening 312 exposing the insulating layer 210 and is positioned over the conductive pillars 190, in accordance with some embodiments.

In some embodiments, the opening 312 is further positioned over the through holes 154. In some embodiments, the opening 312 is positioned over the conductive line 142, in accordance with some embodiments. The mask layer 310 includes a photoresist material or another suitable material. The mask layer 310 is formed by a photolithography process, in accordance with some embodiments.

Figure 3B:
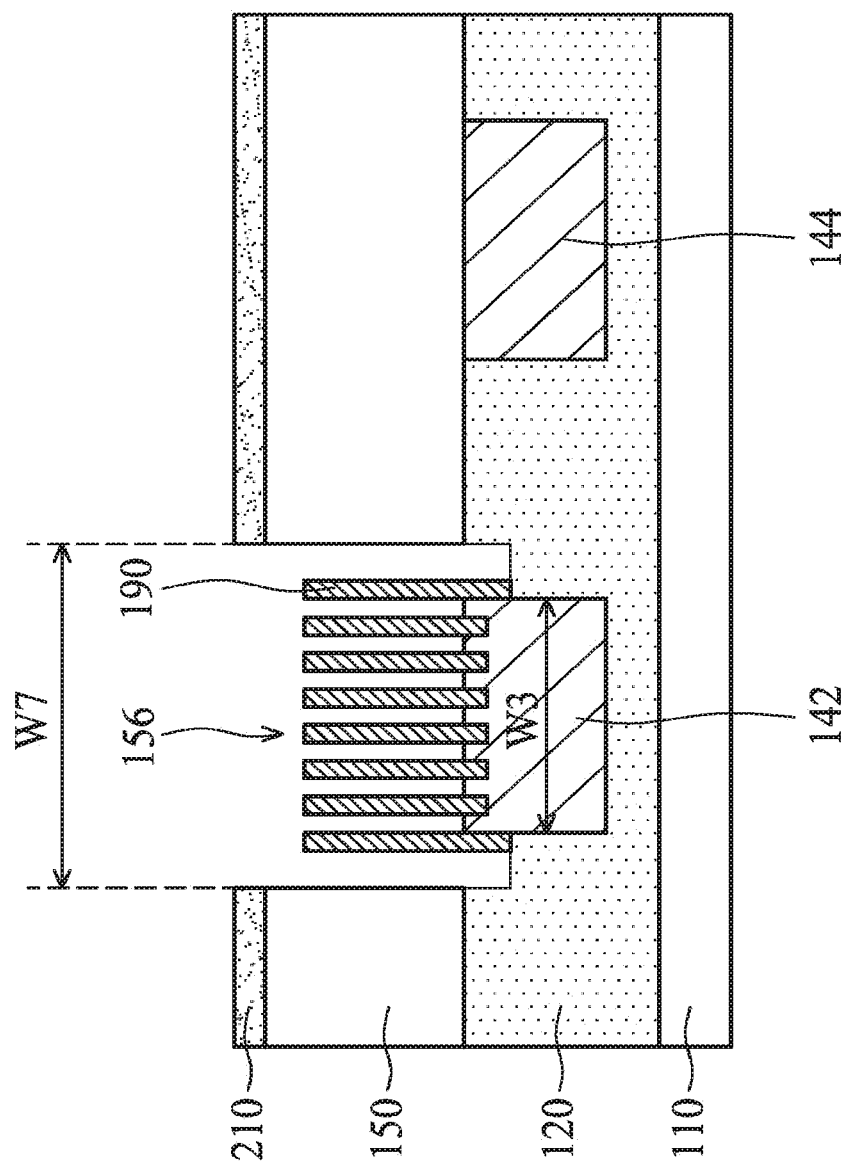

As shown in FIG. 3B, the insulating layer 210 and the dielectric layer 150 under the opening 312 are removed through the opening 312, in accordance with some embodiments. The insulating layer 210 and the dielectric layer 150 under the opening 312 are removed by an etching process, in accordance with some embodiments.

The etching process includes a dry etching process, in accordance with some embodiments. After the etching process, a recess 156 is formed in the dielectric layer 150 to expose the conductive line 142 and the conductive pillars 190, in accordance with some embodiments. The recess 156 further exposes the dielectric layer 120 adjacent to the conductive line 142, in accordance with some embodiments.

The recess 156 has a width W7, in accordance with some embodiments. The width W7 is greater than the width W3 of the conductive line 142, in accordance with some embodiments. A ratio of the width W7 to the width W3 ranges from about 1.3 to about 1.5, in accordance with some embodiments. Thereafter, the mask layer 310 is removed, in accordance with some embodiments.

As shown in FIG. 3C, a conductive layer 320 is formed over the conductive line 142, in accordance with some embodiments. The conductive layer 320 is formed by a selective deposition process. The selective deposition process includes a chemical vapor deposition process, an atomic layer deposition process, or an electroless plating process, in accordance with some embodiments.

The selective deposition process deposits a conductive material only on a conductive structure and not on a dielectric structure, in accordance with some embodiments. Therefore, the selective deposition process deposits the conductive layer 320 only on the conductive line 142 and not on the dielectric layer 120, in accordance with some embodiments. Therefore, the conductive layer 320 is substantially self-aligned with the conductive line 142. The conductive layer 320 is positioned between the conductive pillars 190, in accordance with some embodiments.

As shown in FIG. 3C, an insulating layer 330 is formed over the dielectric layer 150 to fill the recess 156, in accordance with some embodiments. The insulating layer 330 includes silicon oxide or other suitable insulating materials. The insulating layer 330 is formed by a spin coating process or another suitable process.

Figure 3D:
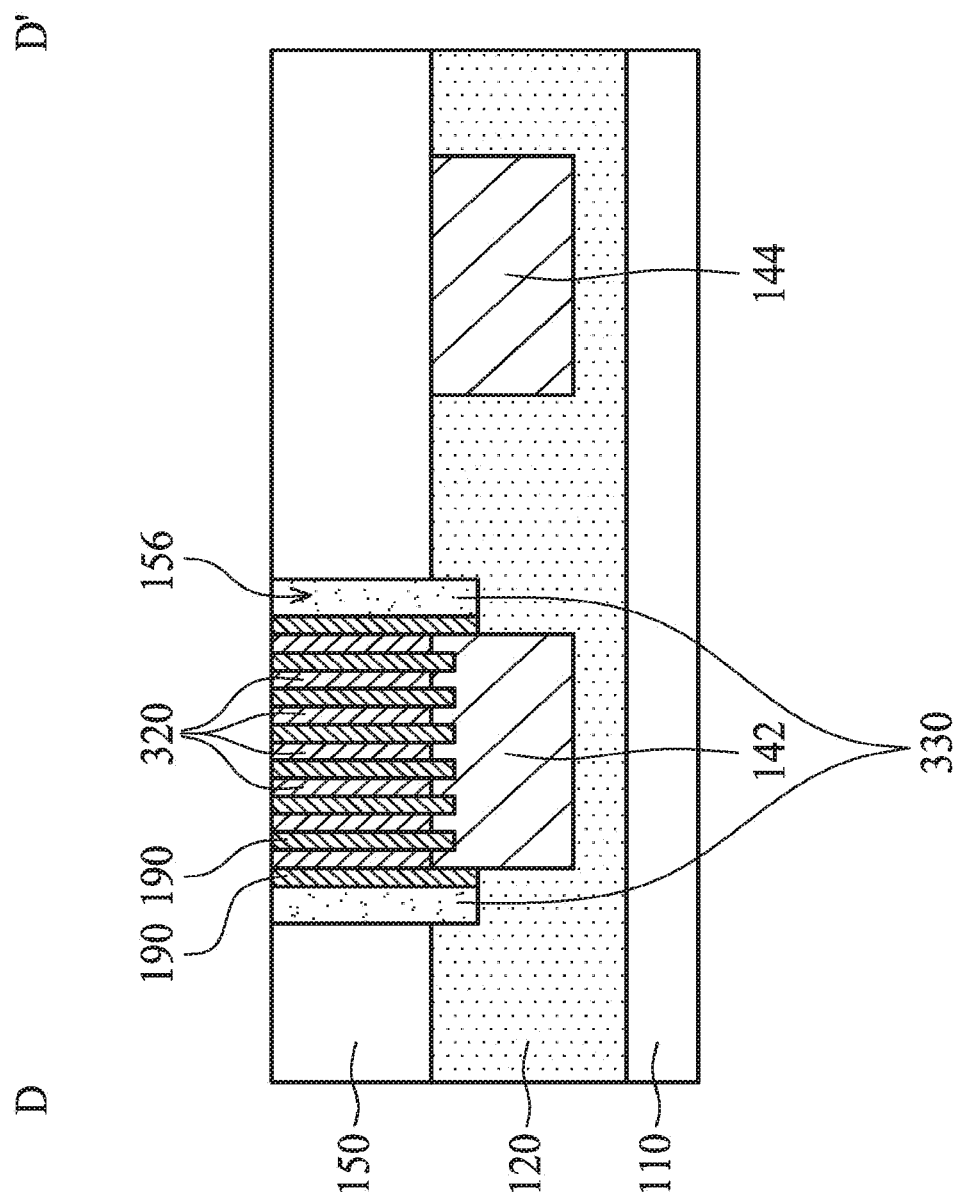

FIG. 4A is a top view of the structure of FIG. 3D, in accordance with some embodiments. FIG. 3D is a cross-sectional view illustrating the structure along sectional line D-D' in FIG. 4A, in accordance with some embodiments.

As shown in FIGS. 3D and 4A, the insulating layers 210 and 330 outside of the recess 156 are removed, in accordance with some embodiments. In some embodiments, the insulating layers 210 and 330 outside of the recess 156 are removed by a planarization process (e.g., a CMP process). In some embodiments, after the planarization process, the insulating layer 330 remaining in the recess 156 is positioned at two opposite sides of the conductive line 142. In some other embodiments (not shown), a portion of the insulating layer 330 remains over the conductive pillars 190 and the conductive layer 320.

Figure 3E:
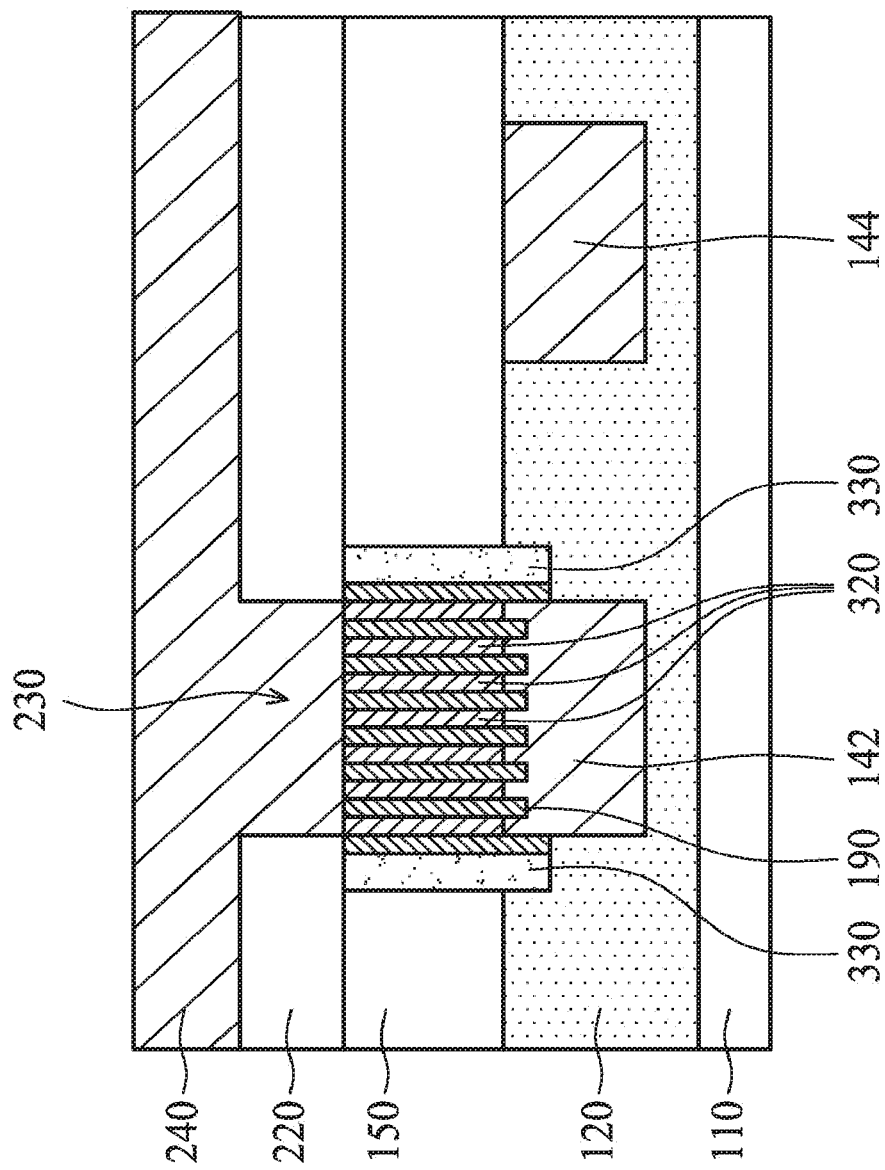

As shown in FIG. 3E, a dielectric layer 220 is deposited over the dielectric layer 150, the conductive pillars 190, and the insulating layer 330, in accordance with some embodiments. As shown in FIG. 3E, a trench 230 is formed in the dielectric layer 220, in accordance with some embodiments.

The trench 230 passes through the dielectric layer 220 to expose the conductive pillars 190 and the conductive layer 320, in accordance with some embodiments. As shown in FIG. 3E, a conductive layer 240 is deposited over the dielectric layer 220 to fill the trench 230, in accordance with some embodiments.

Figure 3F:
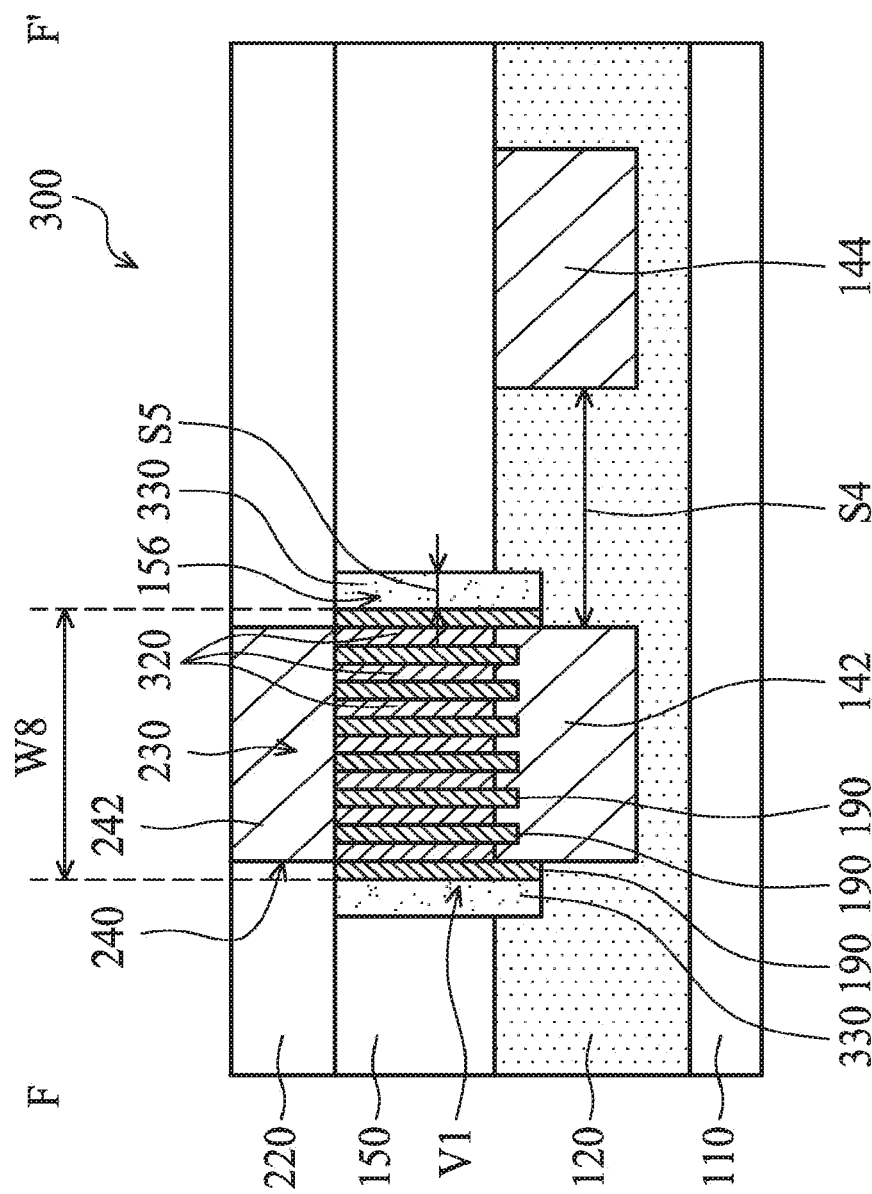
Figure 4B:
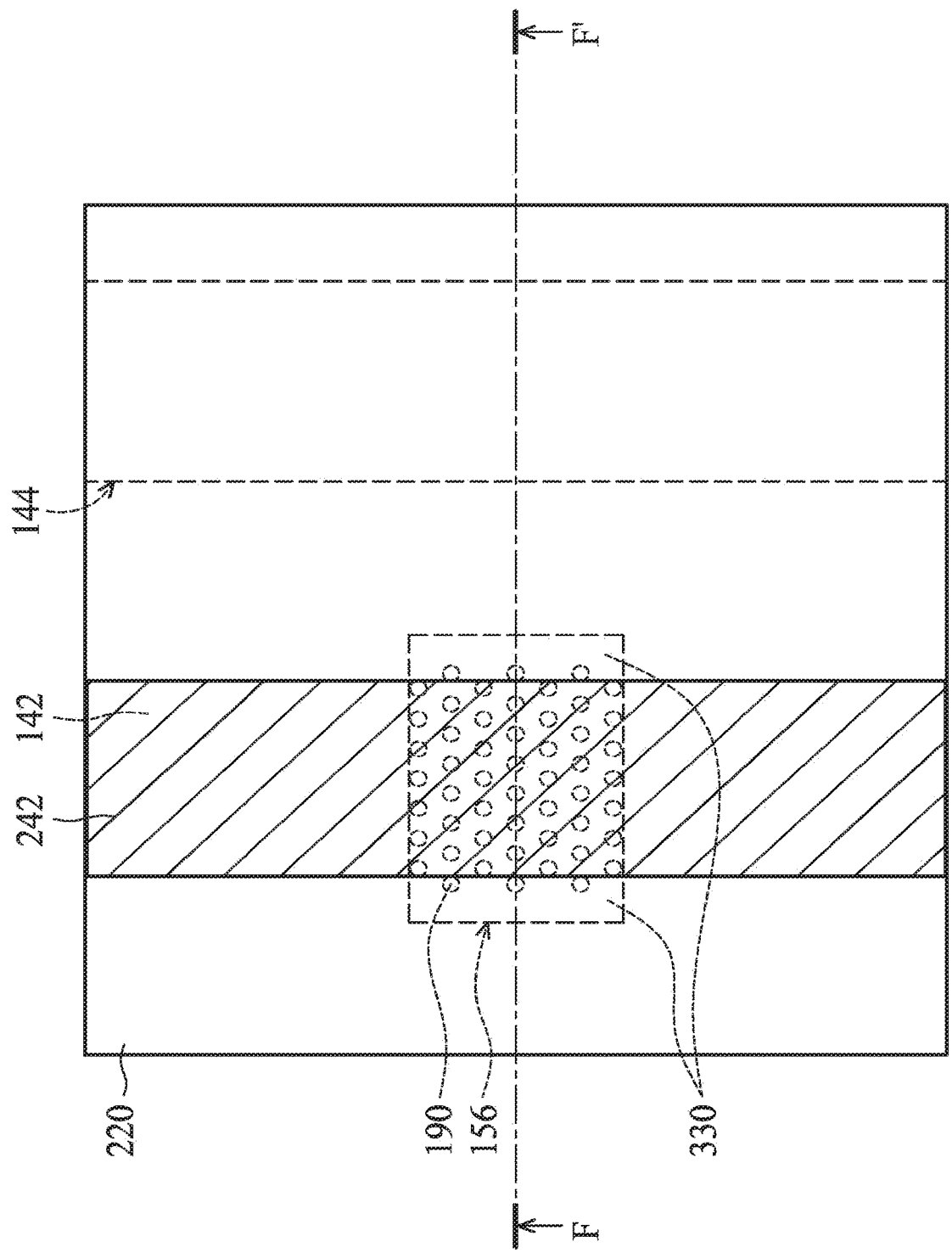
FIG. 4B is a top view of the structure of FIG. 3F, in accordance with some embodiments.

FIG. 4B is a top view of the structure of FIG. 3F, in accordance with some embodiments. FIG. 3F is a cross-sectional view illustrating the structure along sectional line F-F' in FIG. 4B, in accordance with some embodiments.

As shown in FIGS. 3F and 4B, the conductive layer 240 outside of the trench 230 is removed, in accordance with some embodiments. In some embodiments, the conductive layer 240 outside of the trench 230 is removed by a planarization process (e.g., a chemical mechanical polishing process). After the planarization process, the conductive layer 240 remaining in the trench 230 forms a conductive line 242, in accordance with some embodiments. In this step, a semiconductor device structure 300 is substantially formed, in accordance with some embodiments.

In the semiconductor device structure 300, the conductive pillars 190 pass through the conductive layer 320, in accordance with some embodiments. The conductive pillars 190 and the conductive layer 320 together form a conductive via structure V1, in accordance with some embodiments. The conductive via structure V1 electrically connects the conductive line 242 to the conductive line 142, in accordance with some embodiments.

A spacing S5 is between the conductive via structure V1 and the inner wall of the recess 156, in accordance with some embodiments. A ratio of the spacing S5 to a width W8 of the conductive via structure V1 ranges from about 0.3 to about 0.5, in accordance with some embodiments. A ratio of the spacing S5 to the spacing S4 between the conductive lines 142 and 144 ranges from about 0.3 to about 0.7, in accordance with some embodiments.

The formation of the conductive layer 320 may increase the contact areas between the conductive via structure V1 and the conductive line 142 and between the conductive via structure V1 and the conductive line 242, in accordance with some embodiments. Therefore, the contact resistance between the conductive via structure V1 and the conductive line 142 and between the conductive via structure V1 and the conductive line 242 is reduced.

Although the methods described above are used to form the conductive via structures V and V1 electrically connecting with the conductive lines 142 and 242, the invention is not limited thereto. The method described above may be used to form conductive pillars (and a conductive layer) over other conductive structures. For example, the method described above is used to form contact structures over a source region and a drain region of a transistor.

Figure 5:
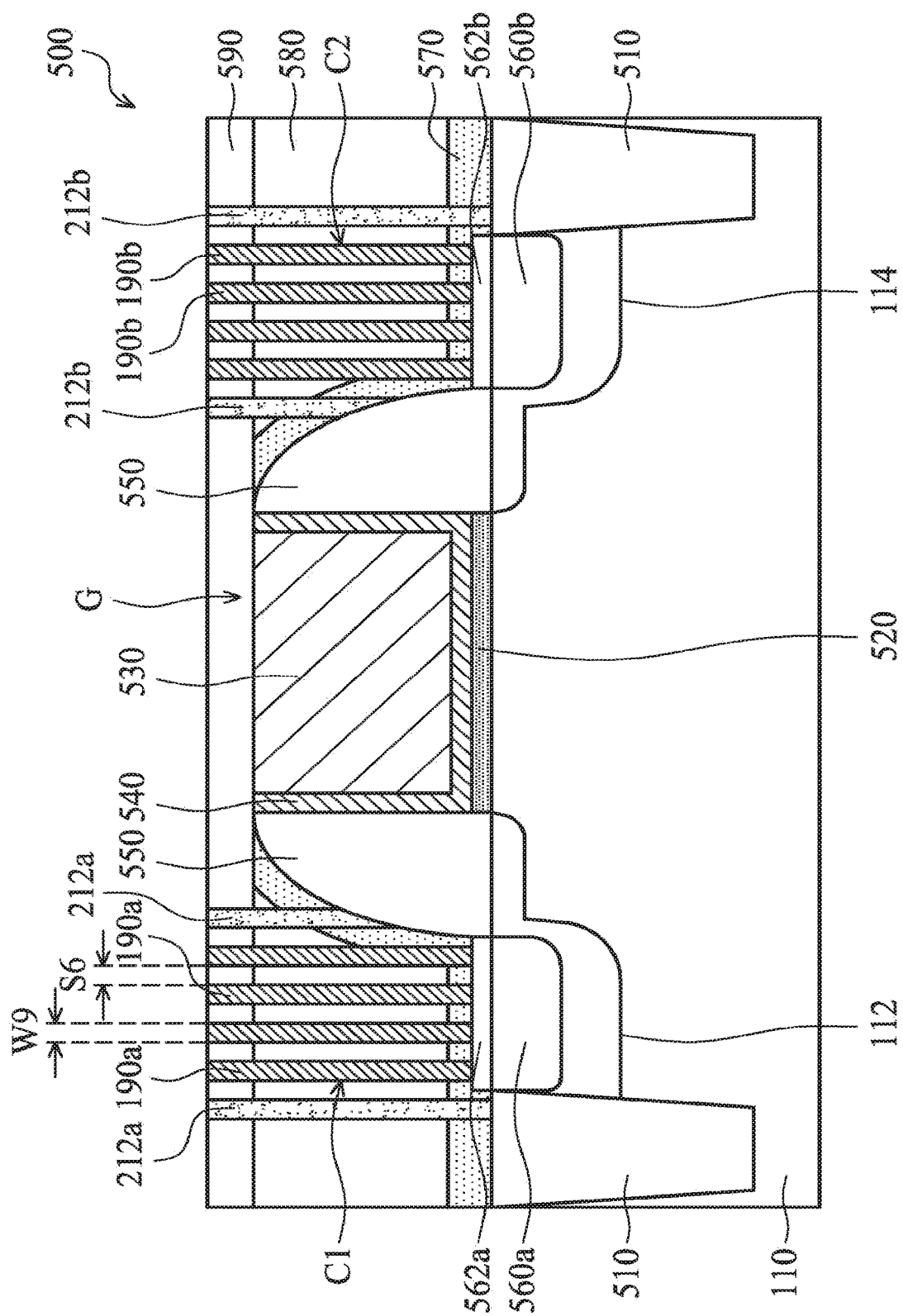
FIG. 5 is a cross-sectional view of a semiconductor device structure, in accordance with some embodiments.

FIG. 5 is a cross-sectional view of a semiconductor device structure 500, in accordance with some embodiments. As shown in FIG. 5, a semiconductor substrate 110 is provided, in accordance with some embodiments. As shown in FIG. 5, isolation structures 510 are formed in the semiconductor substrate 110 to define various active regions in the semiconductor substrate 110, and to electrically isolate neighboring devices (e.g. transistors) from one another.

The isolation structure 510 may be made of a dielectric material, such as silicon oxide, silicon nitride, silicon oxynitride, fluoride-doped silicate glass (FSG), a low-K dielectric material, other suitable materials, or combinations thereof. The isolation structure 510 may be formed by using an isolation technology, such as local oxidation of semiconductor (LOCOS), shallow trench isolation (STI), or the like.

In some embodiments, the formation of the isolation structure 510 includes patterning the semiconductor substrate 110 by a photolithography process, etching a trench in the semiconductor substrate 110 (for example, by using a dry etching, wet etching, plasma etching process, or a combination thereof), and filling the trench (for example, by using a chemical vapor deposition process) with the dielectric material.

As shown in FIG. 5, a gate dielectric layer 520 and a gate electrode 530 are formed over the semiconductor substrate 110, in accordance with some embodiments. The gate dielectric layer 520 may be made of a dielectric material, such as a high dielectric constant (high-k) material.

The high-k material may be made of hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof. The gate dielectric layer 520 may be formed by an atomic layer deposition (ALD) process, a chemical vapor deposition (CVD) process, or another suitable process.

The gate electrode 530 is formed over the gate dielectric layer 520. The gate electrode 530 (also called a metal gate electrode) is formed by a gate-last approach or a replacement-gate (RPG) approach. The gate electrode 530 may be made of a suitable metal material, such as aluminum, tungsten, gold, platinum, cobalt, another suitable metal, an alloy thereof, or a combination thereof. The gate electrode 530 may be formed by using a PVD process, CVD process, plating process, or the like, or a combination thereof.

As shown in FIG. 5, the gate electrode 530 is formed between spacers 550, which have been previously formed. The spacers 550 may be made of a dielectric material, such as silicon nitride, silicon oxynitride, or a combination thereof. The structure of the spacers 550 shown in FIG. 5 is merely an example. Other configurations of the spacers 550 are also possible. For example, a sealing layer (not shown) is formed between the spacers 550 and the gate electrode 530.

In some embodiments, a work function metal layer 540 is formed between the spacers 550 and the gate electrode 530 and between the gate electrode 530 and the gate dielectric layer 520. The work function metal layer 540 provides desired work function for transistors to enhance device performance including improved threshold voltage. In the embodiments of forming an NMOS transistor, the work function metal layer 540 can be an n-type metal. The n-type metal may be made of tantalum, tantalum nitride, or combinations thereof.

On the other hand, in the embodiments of forming a PMOS transistor, the work function metal layer 540 can be a p-type metal. The p-type metal may be made of titanium, titanium nitride, other suitable materials, or combinations thereof.

The work function metal layer 540 may also be made of hafnium, zirconium, titanium, tantalum, aluminum, metal carbides (e.g., hafnium carbide, or zirconium carbide), aluminides, ruthenium or combinations thereof. The work function metal layer 540 may be formed by using a PVD process, CVD process, ALD process, plating process, another suitable method, or combinations thereof.

Doped regions 112 and 114 may be formed in the semiconductor substrate 110 using a suitable process, such as an ion implantation process. The doped region 112 may include a lightly doped region and a heavily doped source region, in accordance with some embodiments. The doped region 114 may include a lightly doped region and a heavily doped drain region, in accordance with some embodiments. The doped regions 112 and 114 may be referred as conductive structures.

Stressors 560a and 560b may be formed in the doped regions 112 and 114 by using suitable processes. The suitable processes include, for example, an etching process for removing a portion of the semiconductor substrate 110 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

As shown in FIG. 5, metal silicide regions 562a and 562b are formed in the stressors 560a and 560b respectively, in accordance with some embodiments. In some embodiments, the metal silicide regions 562a and 562b are made of a silicide material of a suitable metal material. The suitable metal material may include cobalt (Co), nickel (Ni), platinum (Pt), titanium (Ti), ytterbium (Yb), molybdenum (Mo), erbium (Er), or combinations thereof.

A contact etch stop layer 570 is formed over the semiconductor substrate 110 and sidewalls of the spacers 550, in accordance with some embodiments. The contact etch stop layer 570 may be made of a dielectric material, such as silicon nitride. The contact etch stop layer 570 may be conformally formed on the sidewalls of the spacers 550 and the semiconductor substrate 110. However, in some embodiments, the contact etch stop layer 570 is not formed.

As shown in FIG. 5, a dielectric layer 580 is then deposited over the semiconductor substrate 110, in accordance with some embodiments. The gate electrode 530, the work function metal layer 540, and the gate dielectric layer 520 together form a gate stack G (i.e., a metal gate stack), which is embedded the dielectric layer 580. The gate stack G is positioned between the doped regions 112 and 114, in accordance with some embodiments.

The dielectric layer 580 may be made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof. The dielectric layer 580 may be deposited by any suitable process, such as a CVD process, an HDPCVD process, a spin-on process, a sputtering process, or a combination thereof.

A stop layer 590 (also called an insulating layer or a dielectric layer) is deposited over the dielectric layer 580, the contact etch stop layer 570, the work function metal layer 540, and the gate electrode 530, in accordance with some embodiments. The stop layer 590 may be made of silicon nitride or other suitable materials.

Thereafter, conductive pillars 190a and 190b and insulating pillars 212a and 212b are formed, in accordance with some embodiments. In this step, the semiconductor device structure 500 is substantially formed. The conductive pillars 190a and 190b and insulating pillars 212a and 212b are formed by performing steps similar to those shown in FIGS. 1E-1M, except that the embodiment of FIG. 5 forms a first set of conductive pillars 190a and insulating pillars 212a and a second set of conductive pillars 190b and insulating pillars 212b.

Therefore, the materials and formation methods of the conductive pillars 190a and 190b and the insulating pillars 212a and 212b of FIG. 5 are similar to those of the conductive pillars 190 and the insulating pillars 212 of FIG. 1M. Furthermore, the embodiment of FIG. 5 does not form the dielectric layer 220 and the insulating layer 210 over the conductive pillars 190 of FIG. 1M.

The conductive pillars 190a pass through the stop layer 590, the dielectric layer 580, and the contact etch stop layer 570 to electrically connect with the metal silicide regions 562a, the stressor 560a, and the doped region 112, in accordance with some embodiments. The conductive pillars 190a together form a contact structure C1.

The insulating pillars 212a pass through the stop layer 590, the dielectric layer 580, and the contact etch stop layer 570, in accordance with some embodiments. The insulating pillars 212a are positioned at two opposite sides of the metal silicide regions 562a, in accordance with some embodiments. Some of the insulating pillars 212a are positioned over the spacer 550, and some of the insulating pillars 212a are positioned over the isolation structure 510, in accordance with some embodiments.

Each of the conductive pillars 190a has a width W9 raging from about 1 nm to about 30 nm. The conductive pillars 190a are spaced apart from each other, in accordance with some embodiments. In some embodiments, the conductive pillars 190a are spaced apart from each other at substantially the same spacing.

The spacing S6 between the conductive pillars 190a ranges from about 0.2 nm to about 30 nm, in accordance with some embodiments. A ratio of the width W9 to the spacing S6 between adjacent ones of the conductive pillars 190a ranges from about 1 to about 5, in accordance with some embodiments.

The conductive pillars 190b pass through the stop layer 590, the dielectric layer 580, and the contact etch stop layer 570 to electrically connect with the metal silicide regions 562b, the stressor 560b, and the doped region 114, in accordance with some embodiments. The conductive pillars 190b together form a contact structure C2.

The insulating pillars 212b pass through the stop layer 590, the dielectric layer 580, and the contact etch stop layer 570, in accordance with some embodiments. The insulating pillars 212b are positioned at two opposite sides of the metal silicide regions 562b, in accordance with some embodiments. Some of the insulating pillars 212b are positioned over the spacer 550, and some of the insulating pillars 212b are positioned over the isolation structure 510, in accordance with some embodiments.

Figure 6:
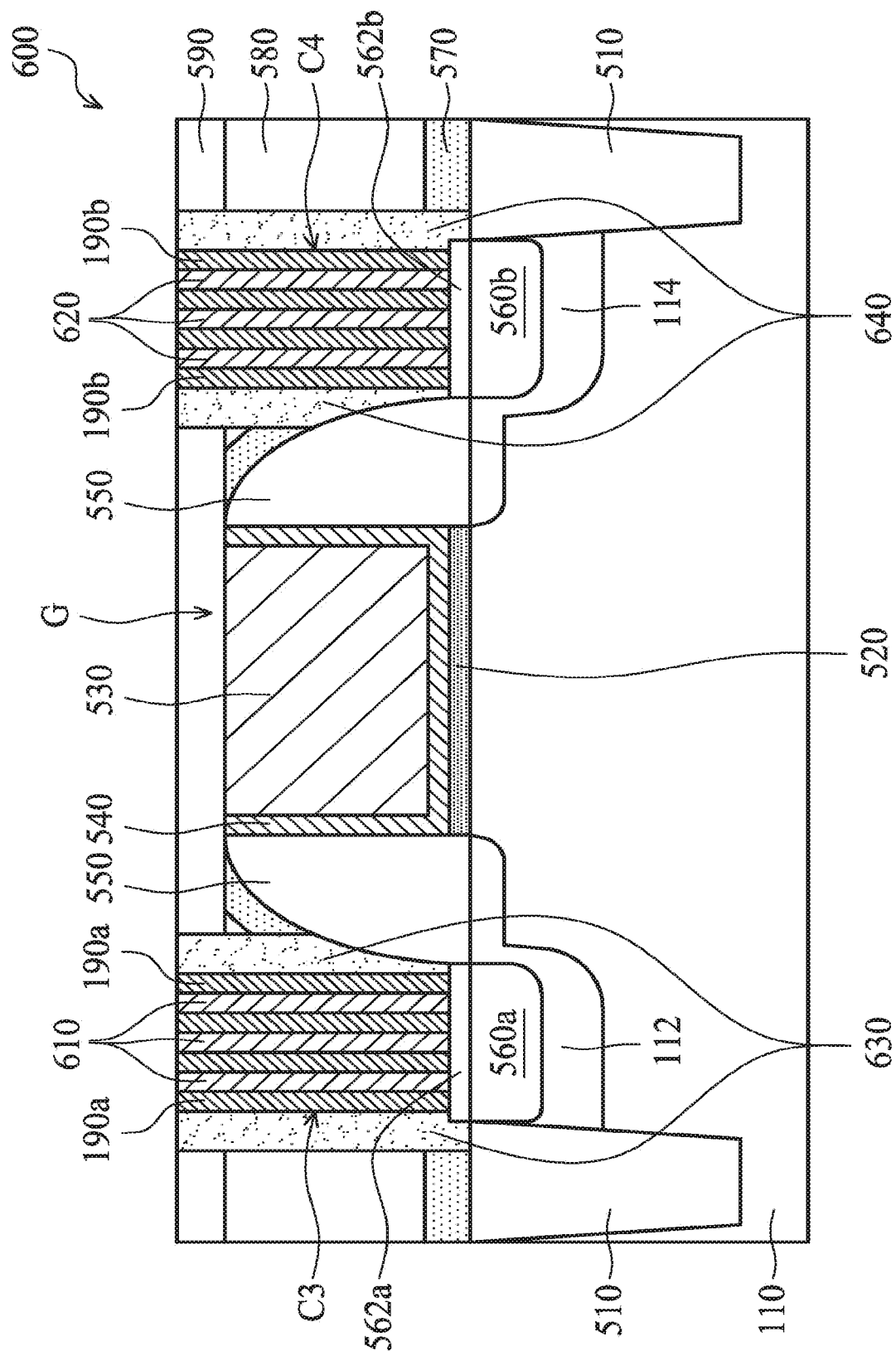
FIG. 6 is a cross-sectional view of a semiconductor device structure, in accordance with some embodiments.

FIG. 6 is a cross-sectional view of a semiconductor device structure 600, in accordance with some embodiments. As shown in FIG. 6, the semiconductor device structure 600 is similar to the semiconductor device structure 500 of FIG. 5, except that the semiconductor device structure 600 further has conductive layers 610 and 620 and insulating layers 630 and 640 and does not have the insulating pillars 212a and 212b, in accordance with some embodiments.

The conductive layer 610 is formed over the metal silicide regions 562a and between the conductive pillars 190a, in accordance with some embodiments. The conductive layer 610 and the conductive pillars 190a together form a contact structure C3, in accordance with some embodiments. The contact structure C3 electrically connects with the metal silicide regions 562a, the stressor 560a, and the doped region 112, in accordance with some embodiments.

The conductive layer 620 is formed over the metal silicide regions 562b and between the conductive pillars 190b, in accordance with some embodiments. The conductive layer 620 and the conductive pillars 190b together form a contact structure C4, in accordance with some embodiments. The contact structure C4 electrically connects with the metal silicide regions 562b, the stressor 560b, and the doped region 114, in accordance with some embodiments.

The insulating layer 630 passes through the stop layer 590, the dielectric layer 580, and the contact etch stop layer 570, in accordance with some embodiments. The insulating layer 630 is positioned at two opposite sides of the metal silicide regions 562a, in accordance with some embodiments. A portion of the insulating layer 630 is positioned over the spacer 550, and another portion of the insulating layer 630 are positioned over the isolation structure 510, in accordance with some embodiments.

The insulating layer 640 passes through the stop layer 590, the dielectric layer 580, and the contact etch stop layer 570, in accordance with some embodiments. The insulating layer 640 is positioned at two opposite sides of the metal silicide regions 562b, in accordance with some embodiments. A portion of the insulating layer 640 is positioned over the spacer 550, and another portion of the insulating layer 640 is positioned over the isolation structure 510, in accordance with some embodiments.

Figure 7:
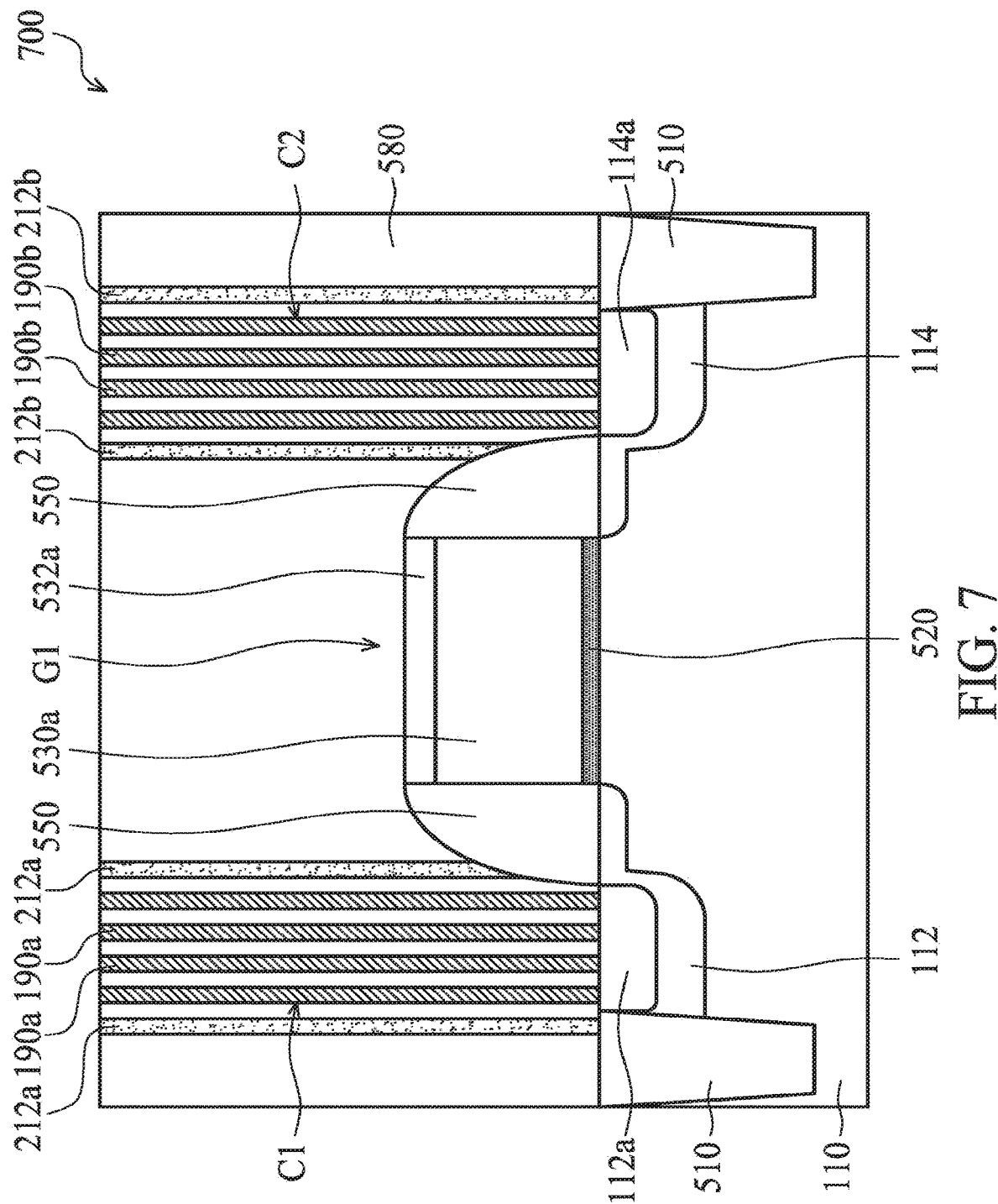
FIG. 7 is a cross-sectional view of a semiconductor device structure, in accordance with some embodiments.

FIG. 7 is a cross-sectional view of a semiconductor device structure 700, in accordance with some embodiments. As shown in FIG. 7, the semiconductor device structure 700 is similar to the semiconductor device structure 500 of FIG. 5, except that the gate electrode 530a of the semiconductor device structure 700 is a poly gate electrode.

The gate electrode 530a and the gate dielectric layer 520 together form a poly gate stack GI. Furthermore, the metal silicide regions 112a and 114a are formed in the doped regions 112 and 114, respectively. A metal silicide region 532a is formed in the gate electrode 530a, in accordance with some embodiments.

Figure 8:
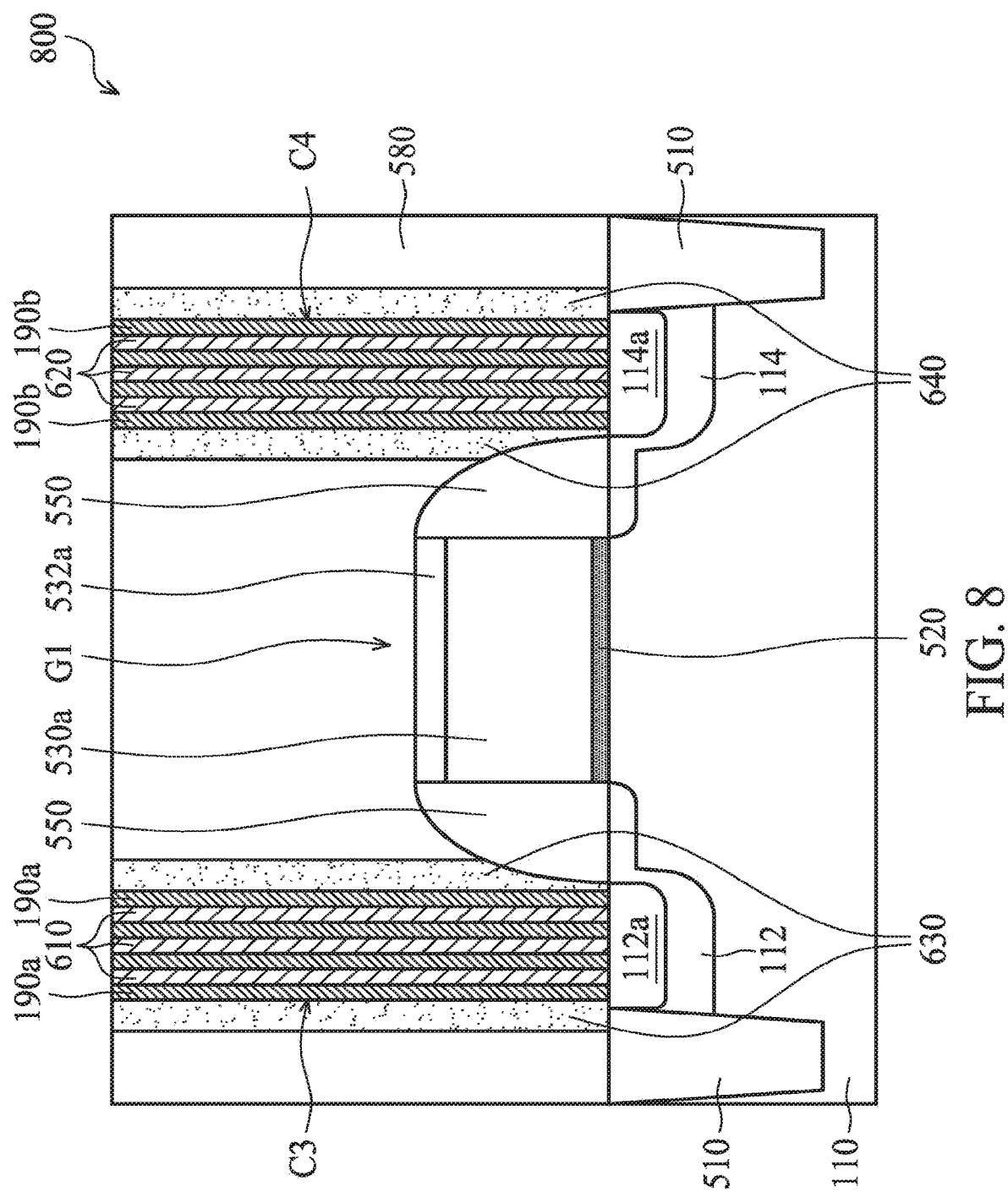
FIG. 8 is a cross-sectional view of a semiconductor device structure, in accordance with some embodiments.

FIG. 8 is a cross-sectional view of a semiconductor device structure 800, in accordance with some embodiments. The semiconductor device structure 800 is similar a combination of the semiconductor device structures 600 and 700. The semiconductor device structure 800 includes the poly gate stack GI and the contact structures C3 and C4, in accordance with some embodiments.

In accordance with some embodiments, semiconductor device structures and methods for forming the same are provided. The methods (for forming the semiconductor device structure) form self-aligned via structures (and/or self-aligned contact structures) by performing a first anodic oxidation process and a second anodic oxidation process on a metal layer to form a mask layer with holes, and once (or twice) performing a selective deposition process. Therefore, the short circuit between two adjacent conductive lines is prevented. The methods may improve the yield of the semiconductor device structure.

In accordance with some embodiments, a semiconductor device structure is provided. The semiconductor device structure includes a semiconductor substrate. The semiconductor device structure includes a first dielectric layer over the semiconductor substrate. The semiconductor device structure includes a first conductive line embedded in the first dielectric layer. The semiconductor device structure includes a second dielectric layer over the first dielectric layer and the first conductive line. The semiconductor device structure includes a second conductive line over the second dielectric layer. The second dielectric layer is between the first conductive line and the second conductive line. The semiconductor device structure includes conductive pillars passing through the second dielectric layer to electrically connect the first conductive line to the second conductive line. The conductive pillars are spaced apart from each other.

In accordance with some embodiments, a semiconductor device structure is provided. The semiconductor device structure includes a semiconductor substrate having a source region and a drain region. The semiconductor device structure includes a gate stack over the semiconductor substrate and between the source region and the drain region. The semiconductor device structure includes a dielectric layer over the semiconductor substrate and covering the source region and a drain region. The semiconductor device structure includes first conductive pillars over the source region and passing through the dielectric layer. The semiconductor device structure includes second conductive pillars over the drain region and passing through the dielectric layer.

In accordance with some embodiments, a method for forming a semiconductor device structure is provided. The method includes forming a conductive structure over or in a substrate. The method includes forming a dielectric layer over the substrate to cover the conductive structure. The method includes forming a first mask layer over the dielectric layer. The first mask layer includes aluminum oxide or titanium oxide, and the first mask layer has holes. The method includes forming a second mask layer covering the holes. The second mask layer has a first opening exposing the holes over the conductive structure. The method includes removing the dielectric layer under the holes exposed by the first opening to form first through holes in the dielectric layer so as to expose the conductive structure. The method includes forming conductive pillars in the first through holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate comprising a source/drain region;
a silicide layer formed on the source/drain region;
a gate stack disposed on the semiconductor substrate and adjacent to the source/drain region;
a dielectric layer on the semiconductor substrate and the source/drain region surrounding the gate stack;
a plurality of conductive pillars in physical contact with the silicide layer and surrounded by the dielectric layer; and
a pair of insulating pillars surrounded by the dielectric layer, disposed on opposite sides of the plurality of conductive pillars, and spaced apart from the plurality of conductive pillars by the dielectric layer.

2. The semiconductor device structure of claim 1, wherein conductive pillars in the plurality of conductive pillars and the pair of insulating pillars are spaced apart from each other at a substantially same spacing.

3. The semiconductor device structure of claim 1, wherein a first insulating pillar from the pair of insulating pillars is positioned between the gate stack and the plurality of conductive pillars and a second insulating pillar is positioned on an isolation region formed within a top portion of the semiconductor substrate adjacent to the source/drain region.

4. The semiconductor device structure of claim 3, wherein the first insulating pillar is shorter than the second insulating pillar and the plurality of conductive pillars.

5. The semiconductor device structure of claim 3, wherein the second insulating pillar is longer than the plurality of conductive pillars.

6. The semiconductor device structure of claim 1, wherein each conductive pillar in the plurality of conductive pillars has a width equal to that of the pair of insulating pillars.

7. The semiconductor device structure of claim 1, wherein the plurality of conductive pillars traverses through an etch stop layer formed on the silicide layer.

8. A semiconductor device, comprising:
a semiconductor substrate comprising source/drain regions;
a gate stack over the semiconductor substrate and between the source/drain regions;
a dielectric layer over the semiconductor substrate and the source/drain regions;
a silicide layer disposed on the source/drain regions; and
a contact structure extending vertically through the dielectric layer and in contact with the silicide layer, the contact structure comprising:
conductive pillars; and
a conductive layer disposed between the conductive pillars and in contact with the conductive pillars.

9. The semiconductor device of claim 8, wherein the conductive layer surrounds sidewalls of the conductive pillars, and wherein a portion of the conductive layer is between two adjacent conductive pillars.

10. The semiconductor device of claim 8, wherein the conductive layer and conductive pillars are in contact with the silicide layer.

11. The semiconductor device of claim 8, further comprising:
another dielectric layer, over the substrate, surrounding the dielectric layer.

12. The semiconductor device of claim 8, wherein the conductive pillars comprise tungsten, titanium, cobalt, or copper.

13. The semiconductor device of claim 8, wherein the conductive pillars are spaced apart from each other at a substantially same spacing.

14. A semiconductor device, comprising:
a substrate with a source/drain (S/D) region;
a silicide layer on the S/D region;
a dielectric on the silicide layer;
a conductive structure traversing through the dielectric and in contact with the silicide, wherein the conductive structure comprises conductive pillars; and
an insulating pillar traversing through the dielectric, spaced apart from the conductive structure, and not in contact with the silicide.

15. The semiconductor device of claim 14, wherein a spacing between the conductive pillars in the conductive structure is substantially equal to a spacing between the conductive structure and the insulating pillar.

16. The semiconductor device of claim 14, wherein the insulating pillar is formed on an isolation region disposed adjacent to the S/D region.

17. The semiconductor device of claim 16, wherein a bottom portion of the conductive pillars and the insulating pillar is surrounded by an etch stop layer formed on the silicide layer and on the isolation region.

18. The semiconductor device of claim 14, wherein the insulating pillar is spaced apart from the conductive structure by the dielectric.

19. The semiconductor device of claim 14, wherein each of the conductive pillars has a width, and wherein a ratio of the width to a spacing between adjacent conductive pillars ranges from about 1 to about 5.

20. The semiconductor device of claim 14, wherein the conductive pillars are shorter than the insulating pillar.

21. The semiconductor device of claim 14, further comprising:
- a gate structure adjacent to the S/D region; and
- a spacer disposed between the gate structure and the conductive structure, wherein the spacer is in contact with the insulating pillar.

* * * * *